US012677622B2

(12) United States Patent
Suzuki et al.

(10) Patent No.: US 12,677,622 B2
(45) Date of Patent: Jul. 7, 2026

(54) SUBSTRATE PROCESSING APPARATUS

(71) Applicant: SCREEN Holdings Co., Ltd., Kyoto (JP)

(72) Inventors: Tatsuhiro Suzuki, Kyoto (JP); Akihiko Taki, Kyoto (JP); Yuta Nishimura, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 944 days.

(21) Appl. No.: 17/857,888

(22) Filed: Jul. 5, 2022

(65) Prior Publication Data

US 2023/0031209 A1 Feb. 2, 2023

(30) Foreign Application Priority Data

Jul. 30, 2021 (JP) ................................. 2021-126155

(51) Int. Cl.
*H10P 72/00* (2026.01)
*B05D 3/04* (2006.01)

(52) U.S. Cl.
CPC ........ *H10P 72/0402* (2026.01); *B05D 3/0486* (2013.01); *H10P 72/0414* (2026.01); *H10P 72/0462* (2026.01)

(58) Field of Classification Search
CPC ... H01L 21/304; H01L 21/648; H01L 21/651; H01L 21/67017; H01P 72/0402; H01P 72/0414; H01P 72/0424; H01P 72/0461; B05D 3/0486
See application file for complete search history.

(56) References Cited

U.S. PATENT DOCUMENTS

| | | | | |
|---|---|---|---|---|
| 6,383,300 B1 | 5/2002 | Saito et al. | ................... | 118/715 |
| 2008/0160905 A1 | 7/2008 | Kim et al. | ................... | 454/340 |
| 2014/0352741 A1 | 12/2014 | Nakamura | | |
| 2015/0314338 A1 | 11/2015 | Morioka et al. | | |
| 2016/0042984 A1* | 2/2016 | Mizuta | ................ | H10P 72/0432 432/2 |
| 2017/0028450 A1* | 2/2017 | Goda | ..................... | B08B 13/00 |
| 2020/0395229 A1 | 12/2020 | Kim et al. | | |

(Continued)

FOREIGN PATENT DOCUMENTS

| | | | | |
|---|---|---|---|---|
| CN | 102280363 B | * 10/2014 | ......... | H10P 72/0402 |
| CN | 112786424 A | 5/2021 | | |

(Continued)

*Primary Examiner* — Michael E Barr
*Assistant Examiner* — Kevin G Lee
(74) *Attorney, Agent, or Firm* — OSTROLENK FABER LLP

(57) ABSTRACT

Each of branch pipes has an internal space into which an atmosphere flows from a main pipe. A downstream damper is provided on the downstream side of an upstream damper in each of the branch pipes, and opens/closes the branch pipe. An upstream switching member switches a state of an upstream space between a state where the upstream space permits an inflow of an external atmosphere and a state where the upstream space prohibits the inflow of the external atmosphere. A downstream switching member switches a state of a downstream space between a state where the downstream space permits an inflow of the external atmosphere and a state where the downstream space prohibits the inflow of the external atmosphere.

13 Claims, 27 Drawing Sheets

(56)         References Cited

U.S. PATENT DOCUMENTS

2021/0134564 A1    5/2021  Sawachi et al.
2021/0210364 A1    7/2021  Nishide et al.

FOREIGN PATENT DOCUMENTS

| | | | |
|---|---|---|---|
| JP | S58-068933 | A | 4/1983 |
| JP | 2012-099582 | A | 5/2012 |
| JP | 2014-197592 | A | 10/2014 |
| JP | 2016-072480 | A | 5/2016 |
| JP | 6611893 | B | 11/2019 |
| JP | 2020-047897 | A | 3/2020 |
| KR | 10-1542491 | A | 7/2015 |
| KR | 10-2016-0059757 | A | 5/2016 |
| KR | 10-2017-0015162 | A | 2/2017 |
| KR | 10-2020-0143537 | A | 12/2020 |
| TW | 463257 | B | 11/2001 |
| TW | 200837312 | A | 9/2008 |
| TW | 201438075 | A | 10/2014 |
| TW | 201835686 | A | 10/2018 |
| TW | 202017081 | A | 5/2020 |

* cited by examiner

| | Upstream damper passage amount [m³/min] | | Rate of inflow to second branch pipe [%] | Judgment |
|---|---|---|---|---|
| | First branch pipe | Second branch pipe | | |
| Reference Example | 2.772 | 0.223 | 7.43 | not good |
| Example | 3.301 | -0.293 | -9.77 | good |

Second upstream damper

Second downstream damper

Second upstream slide damper

Second downstream slide damper

Second upstream damper

Second downstream damper

Second upstream slide damper

Second downstream slide damper

Alkaline atmosphere

Organic solvent atmosphere

Acidic atmosphere

SUBSTRATE PROCESSING APPARATUS

CROSS REFERENCE TO RELATED APPLICATIONS

This application claims the benefit of priority to Japanese Patent Application No. 2021-126155 filed on Jul. 30, 2021. The entire contents of this application are hereby incorporated herein by reference.

BACKGROUND OF THE INVENTION

1. Field of the Invention

The present invention relates to a substrate processing apparatus that processes a substrate.

Examples of substrates to be processed include a semiconductor wafer, a substrate for a FPD (flat panel display) such as a liquid crystal display and an organic EL (electroluminescence) display, a substrate for an optical disc, a substrate for a magnetic disk, a substrate for a magneto-optical disc, a substrate for a photomask, a ceramic substrate, a substrate for a solar cell, and the like.

2. Description of the Related Art

A substrate liquid processing apparatus disclosed in Japanese Patent No. 6611893 includes a processing unit that performs predetermined substrate processing, a first exhaust pipe, a second exhaust pipe, and an exhaust switching unit.

The first exhaust pipe includes an individual exhaust pipe through which an alkaline exhaust flows, an individual exhaust pipe through which an acidic exhaust flows, and an individual exhaust pipe through which an organic exhaust flows. The second exhaust pipe guides an exhaust from the processing unit to the plurality of individual exhaust pipes of the first exhaust pipe.

The exhaust switching unit switches an outflow destination of the exhaust from the processing unit between the individual exhaust pipes. The exhaust switching unit includes three switching mechanisms into which the exhaust from the second exhaust pipe flows. Each of the switching mechanisms includes a main body portion having a hollow box-shape, and a valve element slidable along an inner peripheral surface of the main body portion. An exhaust intake port and an external air intake port are formed on the inner peripheral surface of the main body portion.

In substrate liquid processing disclosed in Japanese Patent No. 6611893, by moving the valve element from a position to close the external air intake port to a position to close the exhaust intake port, it is possible to cause the exhaust to flow into the corresponding individual exhaust pipe, and by moving from the position to close the exhaust intake port to the position to close the external air intake port, it is possible to cause the external air to flow into the corresponding individual exhaust pipe. Therefore, while the exhaust from the processing unit flows into any one of the individual exhaust pipes, by causing the external air to flow into the remaining individual exhaust pipes, it is possible to suppress a change in flow rate of a gas flowing into the individual exhaust pipes.

However, for example, even in a case where a valve element of a certain switching mechanism closes the exhaust intake port, the exhaust may flow into an internal space of the main body portion from a gap between the valve element and the inner peripheral surface of the main body portion. In this case, it may not be possible to sufficiently suppress the unintended inflow of the exhaust from the exhaust intake port to the internal space of the main body portion.

SUMMARY OF THE INVENTION

A preferred embodiment of the present invention provides a substrate processing apparatus including a chamber that houses a substrate, a main pipe that discharges an atmosphere in the chamber, a plurality of branch pipes connected to the main pipe, each of the branch pipes having an internal space into which the atmosphere flows from the main pipe, a plurality of upstream dampers each of which is provided for each of the branch pipes and opens/closes the corresponding branch pipe, a plurality of downstream dampers each of which is provided for each of the branch pipes on the downstream side of the upstream damper and opens/closes the corresponding branch pipe, an upstream switching member that switches, in each of the internal spaces, a state of an upstream space on the downstream side of the upstream damper and on the upstream side of the downstream damper between a state where the upstream space permits an inflow of an external atmosphere from a different route from the main pipe, and a state where the upstream space prohibits the inflow of the external atmosphere, and a downstream switching member that switches, in each of the internal spaces, a state of a downstream space on the downstream side of the downstream damper in each of the internal spaces between a state where the downstream space permits an inflow of the external atmosphere and a state where the downstream space prohibits the inflow of the external atmosphere.

According to the apparatus, by opening/closing the branch pipe by the upstream damper, it is possible to switch the discharge destination of the atmosphere in the chamber. In detail, by opening a single branch pipe among the plurality of branch pipes and closing the other branch pipe, it is possible to set the opened branch pipe as the discharge destination of the atmosphere in the chamber.

By causing the external atmosphere to flow into the downstream space by the corresponding downstream switching member corresponding to the branch pipe which is not the discharge destination of the atmosphere, it is possible to feed the external atmosphere toward the downstream of the corresponding branch pipe. Therefore, it is possible to prevent a change in discharge amount of the atmosphere from the branch pipe due to closing of the branch pipe by the upstream damper.

In addition, the downstream damper is provided on the downstream side of the upstream switching member. Thus, by causing the external atmosphere to flow into the upstream space by the upstream switching member in a state where the downstream damper is closed, it is possible to increase pressure of the upstream space. Therefore, it is possible to suppress the atmosphere discharged from the chamber from passing through the upstream damper and flowing into the unintended branch pipe. Consequently, while the atmosphere from the chamber is flowing into one branch pipe among the plurality of branch pipes, it is possible to effectively suppress the atmosphere from the chamber from flowing into the other branch pipe.

In a preferred embodiment of the present invention, the branch pipe has an upstream inner peripheral surface having a circular shape in a cross-sectional view at a position where the upstream damper is provided. The upstream damper includes an upstream valve element that has a shape along the upstream inner peripheral surface and that opens/closes the branch pipe by being rotated in the branch pipe.

According to the present arrangement, it is possible to close the branch pipe by the upstream damper of a simple arrangement. In a case of adopting an arrangement that the branch pipe is opened/closed by rotating the upstream valve element, in order to smoothly rotate the upstream valve element in the branch pipe, there is a need for providing a gap between an inner peripheral surface of the branch pipe and the upstream valve element. However, in a case where the gap is provided between the inner peripheral surface of the branch pipe and the upstream valve element, there is a possibility that the atmosphere discharged from the chamber passes through the gap between the upstream inner peripheral surface of the branch pipe and the upstream valve element, and flows into the branch pipe which is not the discharge destination.

Even in this case, when the pressure of the upstream space is increased by causing the external atmosphere to flow into the upstream space by the upstream switching member in a state where the branch pipe is closed by the downstream damper, it is possible to suppress the inflow of the atmosphere to the upstream space from the gap between the upstream inner peripheral surface and the upstream valve element. Thereby, it is possible to effectively suppress an unintended inflow of the atmosphere to the branch pipe from the chamber.

In a preferred embodiment of the present invention, the branch pipe has a downstream inner peripheral surface having a circular shape in a cross-sectional view at a position where the downstream damper is provided. The downstream damper includes a downstream valve element having a shape along the downstream inner peripheral surface, the downstream valve element that opens/closes the branch pipe by being rotated in the branch pipe.

According to the present arrangement, by the downstream damper of a simple arrangement, it is possible to close the branch pipe at a position downstream of the upstream damper. In a case of adopting an arrangement that the branch pipe is opened/closed by rotating the downstream valve element, in order to smoothly rotate the downstream valve element in the branch pipe, there is a need for providing a gap between the inner peripheral surface of the branch pipe and the downstream valve element.

In a state where the inflow of the atmosphere discharged from the chamber to the branch pipe is sufficiently suppressed by the upstream damper, a major part of the atmosphere flowing to the downstream side of the downstream damper through the gap between the downstream inner peripheral surface and the downstream valve element is arranged by the external atmosphere flowing into the upstream space by the upstream switching member.

Therefore, even in a case where the gap exists between the inner peripheral surface of the branch pipe and the downstream valve element, a possibility that the atmosphere discharged from the chamber passes through the gap is lower than in the case of the upstream damper. Therefore, while suppressing the atmosphere discharged from the chamber from flowing to the downstream side of the branch pipe, it is possible to smoothly rotate the downstream valve element in the branch pipe.

In a preferred embodiment of the present invention, the substrate processing apparatus further includes a sealing structure that seals a space between the downstream inner peripheral surface and the downstream valve element in a state where the downstream valve element closes the branch pipe. Therefore, it is possible to promptly and sufficiently increase the pressure of the upstream space of the branch pipe.

In a preferred embodiment of the present invention, each of the branch pipes has an upstream opening that connects the upstream space and a space around the branch pipe. The upstream switching member includes an upstream opening/closing damper that opens/closes the upstream opening. Therefore, by opening the upstream opening using the upstream opening/closing damper, it is possible to cause the atmosphere around the branch pipe to flow into the upstream space, and by closing the upstream opening using the upstream opening/closing damper, it is possible to stop the inflow of the atmosphere around the branch pipe to the upstream space.

In a preferred embodiment of the present invention, the substrate processing apparatus further includes a blowing member provided in an exterior of the branch pipe, the blowing member that feeds an atmosphere around the branch pipe to the upstream space via the upstream opening. By feeding the atmosphere around the branch pipe to the upstream space from the blowing member via the upstream opening, it is possible to promptly and sufficiently increase the pressure of the upstream space.

In a preferred embodiment of the present invention, the substrate processing apparatus further includes a supply pipe connected to the branch pipe at a position on the downstream side of the upstream damper and on the upstream side of the downstream damper. The upstream switching member switches the state of the upstream space between a state where a gas is supplied to the upstream space via the supply pipe and a state where supply of the gas to the upstream space via the supply pipe is stopped. By supplying the gas to the upstream space via the supply pipe, it is possible to promptly and sufficiently increase the pressure of the upstream space.

In a preferred embodiment of the present invention, each of the branch pipes has a downstream opening that connects the downstream space and a space around the branch pipe. The downstream switching member includes a downstream opening/closing damper that opens/closes the downstream opening. Therefore, by opening the downstream opening using the downstream opening/closing damper, it is possible to cause the atmosphere around the branch pipe to flow into the downstream space, and by closing the downstream opening using the downstream opening/closing damper, it is possible to stop the inflow of the atmosphere around the branch pipe to the downstream space.

In a preferred embodiment of the present invention, each of the branch pipes has an upstream opening that connects the upstream space and a space around the branch pipe and a downstream opening that connects the downstream space and a space around the branch pipe. The upstream switching member includes an upstream slide damper that opens/closes the upstream opening by sliding with respect to the branch pipe. The downstream switching member includes a downstream slide damper that opens/closes the downstream opening by sliding with respect to the branch pipe. The substrate processing apparatus further includes a coupling member that couples the upstream slide damper and the downstream slide damper, and a slide driving mechanism that causes the upstream slide damper and the downstream slide damper to slide by driving the coupling member.

Therefore, by causing the upstream slide damper to slide with respect to the branch pipe to open the upstream opening, it is possible to cause the gas to flow into the upstream space from the exterior of the branch pipe. Similarly, by causing the downstream slide damper to slide with respect to the branch pipe to open the downstream opening, it is possible to cause the gas to flow into the downstream space from the exterior of the branch pipe.

When the upstream slide damper and the downstream slide damper are coupled by the coupling member, it is possible to drive the coupling member and cause both the upstream slide damper and the downstream slide damper to slide with respect to the branch pipe at the same time. Thereby, it is possible to open/close the upstream opening and the downstream opening at the same time. Therefore, in comparison to an arrangement where separate driving mechanisms open/close the upstream slide damper and the downstream slide damper, it is possible to simplify an arrangement to slide the slide dampers.

In a preferred embodiment of the present invention, the substrate processing apparatus further includes an upstream opening/closing speed adjusting mechanism that adjusts opening/closing speed of the upstream damper, a downstream opening/closing speed adjusting mechanism that adjusts opening/closing speed of the downstream damper, and a downstream flow rate adjusting mechanism that controls a switching action of the downstream switching member and adjusts a flow rate of the external atmosphere flowing into the downstream space.

By adjusting the opening/closing speed of the upstream damper and the downstream damper, it is possible to gradually change a flow rate of the atmosphere flowing into the branch pipe from the main pipe. Then, by adjusting the flow rate of the external atmosphere flowing into the downstream space, it is possible to gradually change a flow rate of the atmosphere discharged from the branch pipe. Thereby, it is possible to suppress a sudden change in discharge amount of the atmosphere from the branch pipe.

In a preferred embodiment of the present invention, the substrate processing apparatus further includes a plurality of processing liquid nozzles that discharge different types of processing liquids from each other toward the substrate housed in the chamber, and a controller programmed to switch the branch pipe into which the atmosphere discharged from the main pipe flows in accordance with the type of the processing liquid supplied to the substrate which is housed in the chamber by controlling the plurality of upstream dampers, the plurality of downstream dampers, the plurality of upstream switching members, and the plurality of downstream switching members.

According to the present arrangement, in accordance with the type of the processing liquid supplied to the substrate which is housed in the chamber, it is possible to switch the branch pipe that discharges the atmosphere in the main pipe. Therefore, it is possible to cause the atmosphere containing a gas and a mist of a proper type of the processing liquid to flow into each of the branch pipes.

In a preferred embodiment of the present invention, the controller is programmed to start, in each of the branch pipes, the inflow of the external atmosphere to the upstream space by the upstream switching member and the inflow of the external atmosphere to the downstream space by the downstream switching member before the upstream damper and the downstream damper close the corresponding branch pipe. Therefore, it is possible to prevent generation of a state where the branch pipe is closed and the inflow of the external atmosphere to the downstream space is stopped. Thereby, it is possible to suppress the flow rate of the atmosphere discharged from the branch pipe from being suddenly lowered.

In a preferred embodiment of the present invention, the plurality of processing liquid nozzles include a chemical liquid nozzle that discharges a chemical liquid toward the substrate housed in the chamber, a rinse liquid nozzle that supplies a rinse liquid toward the substrate housed in the chamber, and an organic solvent nozzle that supplies an organic solvent toward the substrate housed in the chamber. The plurality of branch pipes have a first branch pipe that discharges an atmosphere in the main pipe while the chemical liquid is discharged from the chemical liquid nozzle and while the rinse liquid is discharged from the rinse liquid nozzle, and a second branch pipe that discharges the atmosphere in the main pipe while the organic solvent is discharged from the organic solvent nozzle.

According to the present arrangement, while the chemical liquid is discharged from the chemical liquid nozzle and while the rinse liquid is discharged from the rinse liquid nozzle, the atmosphere in the main pipe is discharged by the first branch pipe. Therefore, a chemical liquid atmosphere containing vapor of the chemical liquid is discharged through the main pipe and the first branch pipe.

At that time, when the second branch pipe is closed by the upstream damper and the downstream damper and the external atmosphere flows into the upstream space of the second branch pipe by the upstream switching member, it is possible to suppress the chemical liquid atmosphere from flowing into the second branch pipe. Further, when the external atmosphere flows into the downstream space of the second branch pipe by the downstream switching member, it is possible to prevent a change in discharge amount of the atmosphere from the second branch pipe. Thereby, while suppressing the chemical liquid atmosphere from mixing into the atmosphere discharged from the second branch pipe, it is possible to suppress a change in discharge amount of the atmosphere discharged from the second branch pipe.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

<Arrangement of Substrate Processing Apparatus According to First Preferred Embodiment>

Figure 1A:
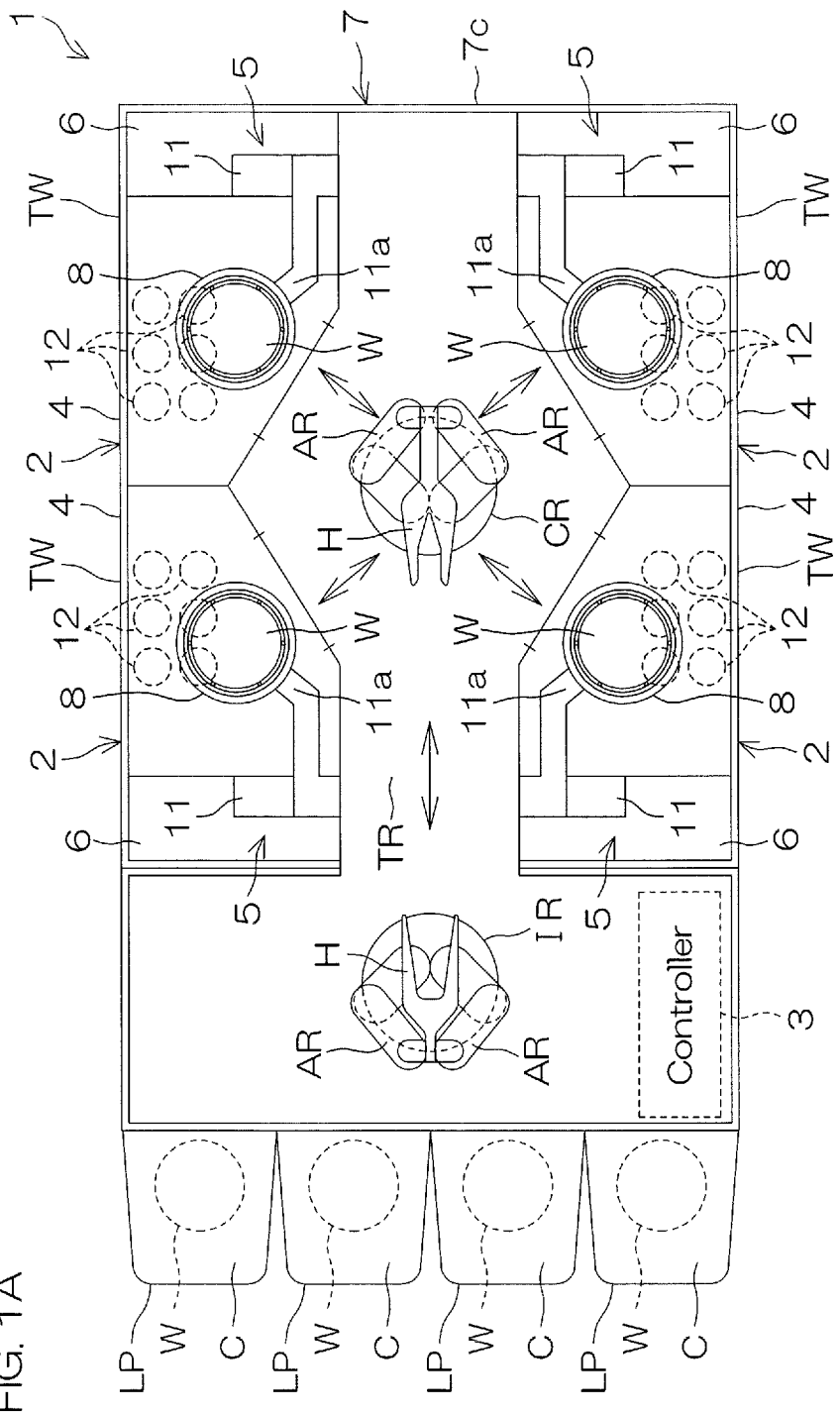
FIG. 1A is a plan view for describing an arrangement example of a substrate processing apparatus according to a first preferred embodiment of the present invention.
Figure 1B:
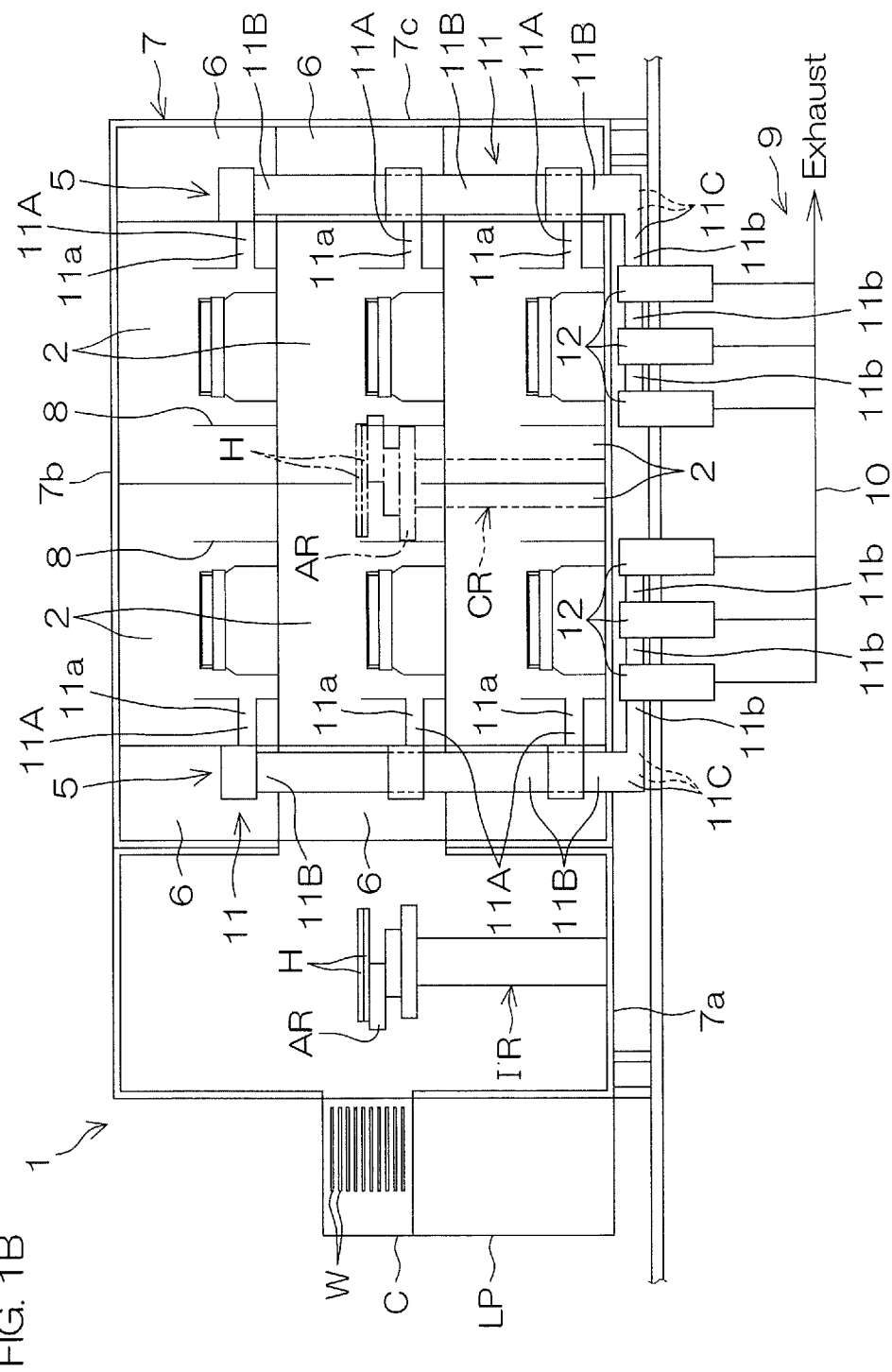
FIG. 1B is a cross-sectional view for describing an arrangement of the substrate processing apparatus.

FIG. 1A is a plan view for describing an arrangement example of a substrate processing apparatus 1 according to a first preferred embodiment of the present invention. FIG. 1B is a cross-sectional view for describing an arrangement of the substrate processing apparatus 1.

The substrate processing apparatus 1 is a single substrate processing type apparatus that processes a substrate W one at a time. In the present preferred embodiment, the substrate W has a disk-shape. The substrate W is a substrate W of a silicon wafer, etc., and has a pair of principal surfaces.

The substrate processing apparatus 1 includes a plurality of processing units 2 each of which includes a single chamber 4 and processes the substrate W, a plurality of discharge units 5 that respectively discharge atmospheres from the plurality of chambers 4, load ports LP (housing holding units) on which carriers C (housings) that house the plural substrates W to be processed in the processing units 2 are mounted, transfer robots (of a first transfer robot IR and a second transfer robot CR) that transfer the substrates W between the load ports LP and the processing units 2, and a controller 3 that controls each of the members provided in the substrate processing apparatus 1.

The first transfer robot IR transfers the substrates W between the carriers C and the second transfer robot CR. The second transfer robot CR transfers the substrates W between the first transfer robot IR and the processing units 2.

Each of the transfer robots is, for example, an articulated arm robot including a pair of articulated arms AR, and a pair of hands H respectively provided in leading ends of the pair of articulated arms AR to be separated from each other up and down.

The plurality of processing units 2 are disposed on both the sides of a transfer route TR on which the substrates W are transferred by the second transfer robot CR along the transfer route TR, and disposed to be stacked in the up and down direction. The plurality of processing units 2 have, for example, the same arrangements.

The plurality of processing units 2 form four processing towers TW respectively disposed at four positions which are horizontally away from each other in a plan view. Each of the processing towers TW includes the plurality of processing units 2 stacked in the up and down direction. Each two of the four processing towers TW are disposed on each of the sides of the transfer route TR extending toward the second transfer robot CR from the load ports LP.

The substrate processing apparatus 1 includes a plurality of fluid boxes 6 that house valves, pipes, etc. Part of the discharge units 5 is housed in the fluid boxes 6. The substrate processing apparatus 1 further includes a frame 7 surrounding the plurality of processing units 2, the plurality of fluid boxes 6, the plurality of discharge units 5, and the plurality of transfer robots in a plan view. The frame 7 has a substantially square shape in a plan view. The frame 7 includes a lower wall 7a, an upper wall 7b, and a side wall 7c coupling the lower wall 7a and the upper wall 7b.

Each of the processing units 2 includes the chamber 4 and a processing cup 8 disposed in the chamber 4, and executes processing on the substrate W in the processing cup 8. The chamber 4 has a housing space in which the substrate W is housed.

The chamber 4 includes an inlet/outlet 4a (see FIG. 3 to be described later) for carrying the substrate W into the housing space and carrying the substrate W out of the housing space by the second transfer robot CR, and a shutter unit 4b (see FIG. 3 to be described later) that opens/closes the inlet/outlet 4a.

The processing unit 2 can process the substrate W with plural types of processing liquids. The processing liquids to be supplied to the substrate W in the chamber 4 include a chemical liquid, a rinse liquid, and an organic solvent, although details will be described later.

An atmosphere in the chamber 4 (in the housing space) is discharged via the discharge unit 5, and processed by an exhaust processing portion 9. The exhaust processing portion 9 includes a plurality of discharge ducts 10 each of which is provided for each type of the atmosphere discharged from the chamber 4.

The exhaust processing portion 9 may include a suction device (not shown) that suctions interiors of the plurality of discharge ducts 10. The suction device is provided in the middle of, or in an end portion of the discharge ducts 10, and includes at least one suction pump, etc., that suctions the plurality of discharge ducts 10. The at-least-one suction pump may be a plurality of suction pumps in one-on-one correspondence with the plurality of discharge ducts 10, or may be a single suction pump that suctions an exhaust from all the discharge ducts 10. The exhaust processing portion 9 is provided in a clean room where the substrate processing apparatus 1 is installed or a facility associated with the clean room. The exhaust processing portion 9 may be part of the substrate processing apparatus 1.

The plurality of discharge units 5 have, for example, the same arrangements. Each of the discharge units 5 includes a main pipe 11 that is connected to the processing cup 8 and discharges the atmosphere from the chamber 4, and a plurality of branch pipes 12 that is connected to the main pipe 11 and discharge the atmosphere from the main pipe 11.

With reference to FIG. 1B, the main pipe 11 has an upstream end portion 11a connected to the processing cup 8, and a downstream end portion 11b positioned inside the chamber 4 in a plan view and connected to the plurality of branch pipes 12. In detail, the main pipe 11 includes an upstream main pipe 11A positioned in the chamber 4, a mid-stream main pipe 11B connected to the upstream main pipe 11A and positioned out of the chamber 4 (fluid box 6), and a downstream main pipe 11C connected to the mid-stream main pipe 11B and the plurality of branch pipes 12 and positioned on the lower side of the lower wall 7a of the frame 7.

The plurality of branch pipes 12 are positioned on the lower side of the plurality of chambers 4 arranging the processing tower TW. The plurality of branch pipes 12 are connected to the downstream main pipe 11C and positioned on the lower side of the lower wall 7a of the frame 7.

With reference to FIG. 1A, the plurality of branch pipes 12 are positioned inside the corresponding chamber 4 in a plan view. Therefore, in comparison to a case where the plurality of branch pipes 12 are positioned outside the corresponding chamber 4, it is possible to reduce the length of the main pipe 11. The plurality of branch pipes 12 are positioned inside the frame 7 and outside the transfer route TR in a plan view. By disposing the plurality of branch pipes 12 inside the frame 7 in a plan view, it is possible to reduce an installation area of the substrate processing apparatus 1.

<Arrangement of Processing Unit According to First Preferred Embodiment>

Figure 2:
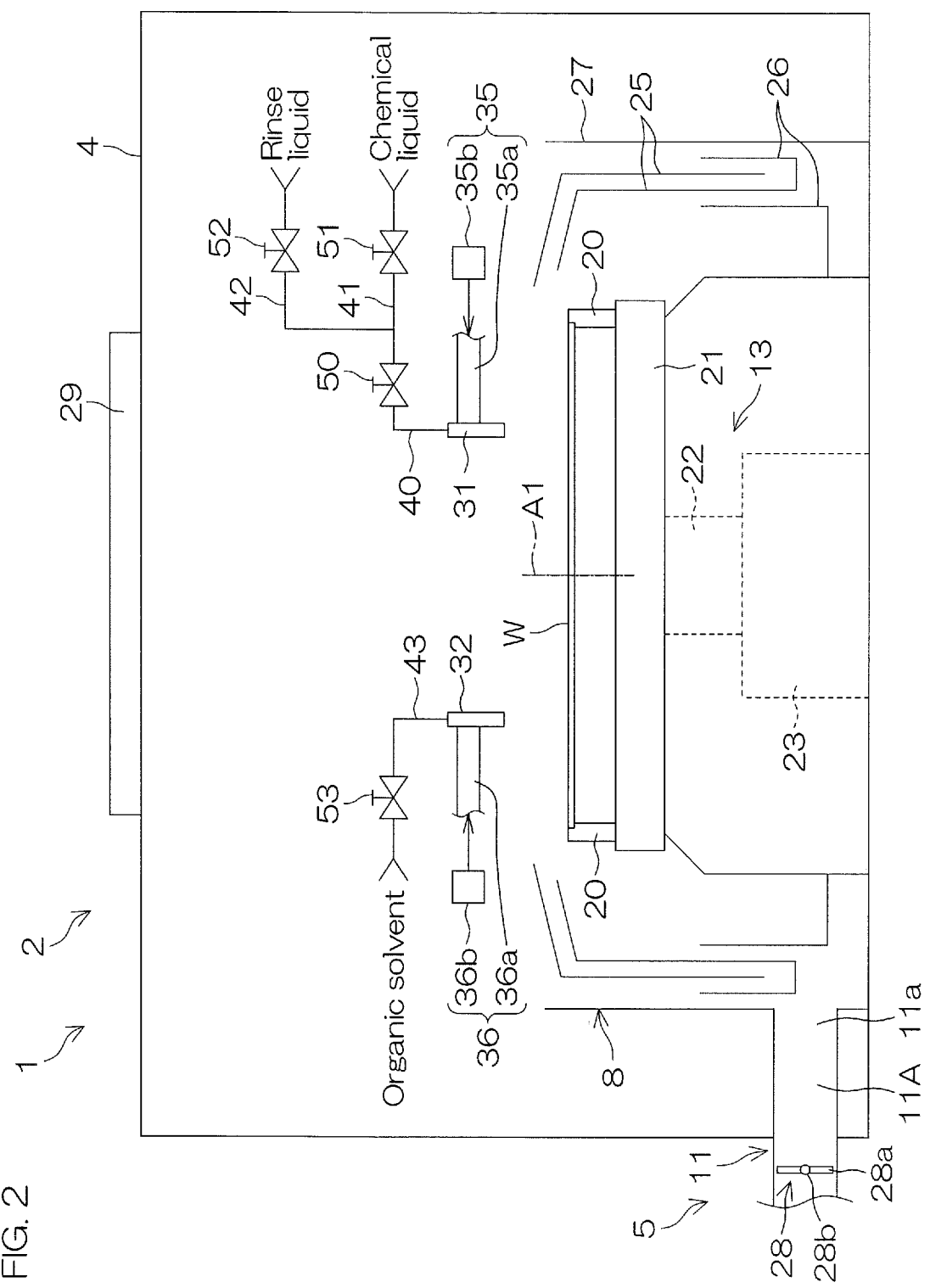
FIG. 2 is a schematic diagram for describing an arrangement of a processing unit provided in the substrate processing apparatus.
Figure 3:
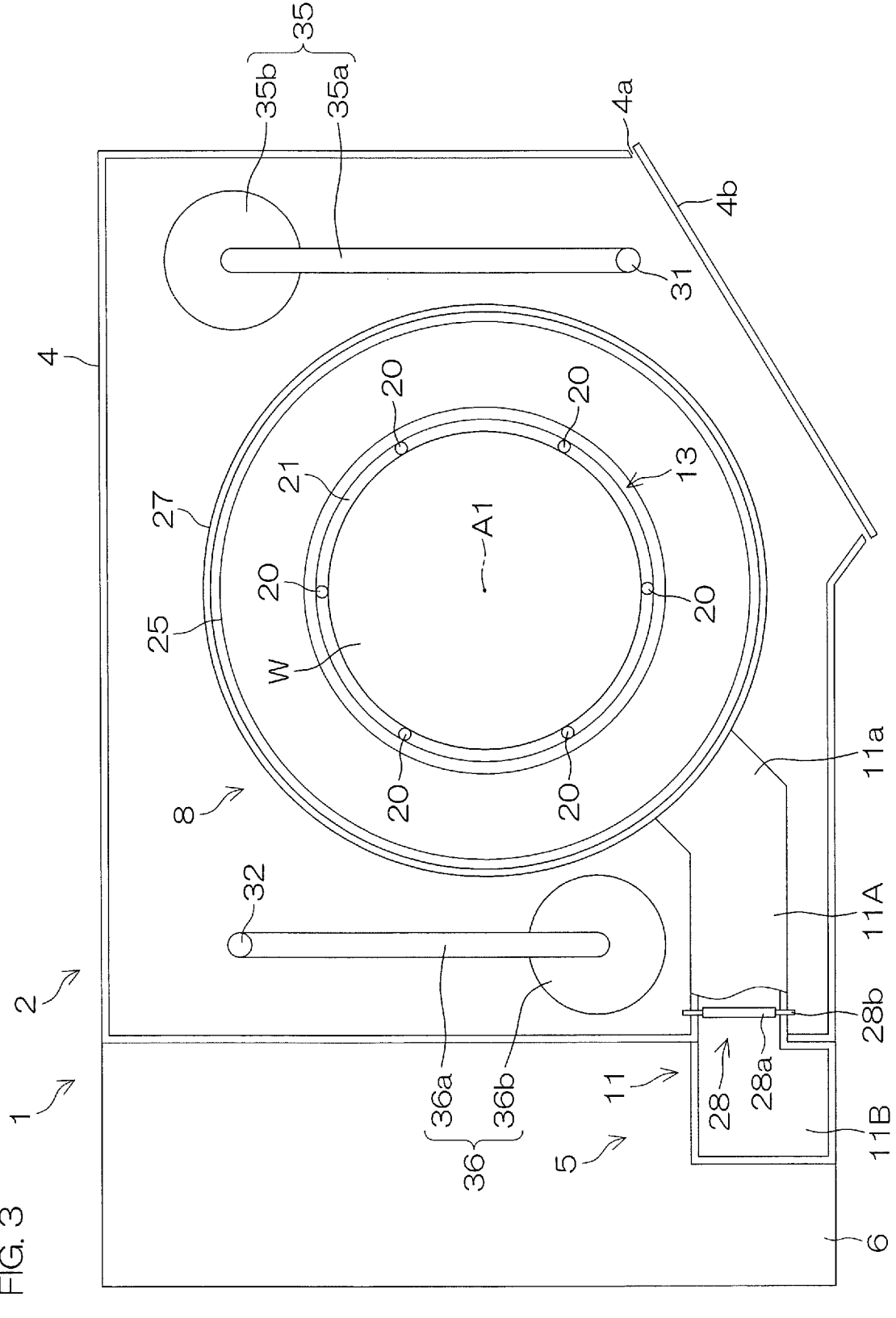
FIG. 3 is a plan view of the processing unit.

FIG. 2 is a schematic diagram for describing an arrangement of the processing unit 2. FIG. 3 is a plan view of the processing unit 2.

The processing unit 2 further includes a spin chuck 13 that rotates the substrate W around a rotational axis A1 while holding the substrate W in a predetermined processing posture. The rotational axis A1 passes through a central portion of the substrate W and is orthogonal to each of the principal surfaces of the substrate W held in the processing posture. The processing posture is, for example, a posture of the substrate W shown in FIG. 2, a horizontal posture with which the principal surfaces of the substrate W become horizontal surfaces. In a case where the processing posture is the horizontal posture, the rotational axis A1 extends vertically. The spin chuck 13 is an example of a rotation holding member that rotates the substrate W around the rotational axis A1 while holding the substrate W in the processing posture.

The spin chuck 13 includes a spin base 21 having a disk shape along the horizontal direction, a plurality of chuck pins 20 that grip the substrate W above the spin base 21 and hold the substrate W at a holding position, a rotating shaft 22 that is coupled to the spin base 21 and extends in the vertical direction, and a rotation driving mechanism 23 that rotates the rotating shaft 22 around a central axis thereof (rotational axis A1).

The plurality of chuck pins 20 are disposed on an upper surface of the spin base 21 while being spaced from each other in the circumferential direction of the spin base 21 (see FIG. 3).

The rotation driving mechanism 23 includes, for example, an actuator such as an electric motor. The rotation driving mechanism 23 rotates the spin base 21 and the plurality of chuck pins 20 around the rotational axis A1 by rotating the rotating shaft 22. Thereby, the substrate W is rotated around the rotational axis A1 together with the spin base 21 and the plurality of chuck pins 20.

The plurality of chuck pins 20 are movable between a close position to be brought into contact with a peripheral edge portion of the substrate W to grip the substrate W, and an open position to be retreated from the peripheral edge portion of the substrate W. The plurality of chuck pins 20 are moved by an opening/closing mechanism (not shown).

At the close position, the plurality of chuck pins 20 grip the peripheral edge portion of the substrate W and hold the substrate W horizontally. The opening/closing mechanism includes, for example, a link mechanism, and an actuator that gives a driving force to the link mechanism such as an electric motor or an air cylinder.

The processing cup 8 receives a liquid scattering from the substrate W which is held by the spin chuck 13. The processing cup 8 includes a plurality of (two in the example of FIG. 2) guards 25 that receive the liquid outward scattering from the substrate W which is held by the spin chuck 13, a plurality of (two in the example of FIG. 2) cups 26 that respectively receive the liquid guided downward by the plurality of guards 25, and a cylindrical outer wall member 27 surrounding the plurality of guards 25 and the plurality of cups 26. The upstream end portion 11a of the main pipe 11 is connected to the outer wall member 27.

The plurality of guards 25 are separately elevated and lowered by a guard elevating and lowering driving mechanism (not shown). The guard elevating and lowering driving mechanism includes, for example, an actuator that drives to elevate and lower the guards 25 such as an electric motor or an air cylinder.

An arrangement of the processing cup 8 is not limited to the arrangement shown in FIG. 2. For example, the number of the guards 25 provided in the processing cup 8 may be one or may be three or more. The number of the cups 26 provided in the processing cup 8 may be one or may be three or more.

The discharge unit 5 includes a main pipe damper 28 that opens/closes the main pipe 11. The main pipe damper 28 is an adjustment valve that changes an opening rate of a space in the pipe or an opening formed in the pipe and adjusts a flow rate of a fluid flowing in the pipe. The same applies to dampers to be described below.

The main pipe damper 28 is, for example, a rotation type damper, that is, a butterfly damper. The main pipe damper 28 is not limited to the butterfly damper but only required to be capable of adjusting the flow rate of the fluid in the main pipe 11 and opening/closing the main pipe 11.

The butterfly damper includes a valve element having a shape along an inner peripheral surface of a pipe, and a valve element rotating shaft that rotates the valve element in the pipe.

In a case where the main pipe damper 28 is the butterfly damper, the main pipe damper 28 includes a valve element 28a having a shape along an inner peripheral surface of the main pipe 11, and a valve element rotating shaft 28b that rotates the valve element 28a in the main pipe 11. The valve element rotating shaft 28b may be arranged to be rotated by an actuator such as a motor or an air cylinder, or may be arranged to be rotated manually.

In the present preferred embodiment, the main pipe damper 28 is provided in the upstream main pipe 11A. However, a position of the main pipe damper 28 is not limited to this. That is, the main pipe damper 28 may be provided in the mid-stream main pipe 11B or may be provided in the downstream main pipe 11C (also see FIG. 1B).

The processing unit 2 may include a blowing unit 29 disposed on an upper wall of the chamber 4. The blowing unit 29 is, for example, an FFU (fan filter unit) that feeds the external air of the chamber 4 into the chamber 4 while cleaning the air. By an action of the blowing unit 29, discharge of the atmosphere from the chamber 4 to the discharge unit 5, that is, exhaust of the chamber 4 is facilitated.

The processing unit 2 includes a plurality of moving nozzles movable at least in the horizontal direction. The plurality of moving nozzles further include a first moving nozzle 31 that selectively discharges a continuous flow of the chemical liquid and a continuous flow of the rinse liquid toward an upper surface (upper principal surface) of the substrate W held by the spin chuck 13, and a second moving nozzle 32 that discharges a continuous flow of the organic solvent toward the upper surface of the substrate W held by the spin chuck 13.

The first moving nozzle 31 is an example of a chemical liquid nozzle and also an example of a rinse liquid nozzle. The second moving nozzle 32 is an example of an organic solvent nozzle. Both the first moving nozzle 31 and the second moving nozzle 32 are an example of a processing liquid nozzle. That is, the processing unit 2 includes the plurality of processing liquid nozzles that discharge different types of the processing liquids from each other toward the substrate W housed in the chamber 4.

The first moving nozzle 31 and the second moving nozzle 32 are respectively moved in the horizontal direction by a plurality of nozzle moving mechanisms (of a first nozzle moving mechanism 35 and a second nozzle moving mechanism 36).

Each of the nozzle moving mechanisms can move the corresponding nozzle between a central position and a retreat position. The central position is a position where the nozzle opposes a central region of the upper surface of the substrate W. The central region of the upper surface of the substrate W is a region including a rotational center (central portion) and a portion around the rotational center on the upper surface of the substrate W. The retreat position is a position where the nozzle does not oppose the upper surface of the substrate W, the position outside the processing cup 8.

Each of the nozzle moving mechanisms includes an arm that supports the corresponding nozzle (of a first arm 35a or a second arm 36a), and an arm moving mechanism that moves the corresponding arm in the horizontal direction (of a first arm moving mechanism 35b or a second arm moving mechanism 36b). Each of the arm moving mechanisms includes an actuator such as an electric motor or an air cylinder.

Unlike the present preferred embodiment, the first moving nozzle 31 and the second moving nozzle 32 may be arranged to be integrally moved by a common nozzle moving mechanism. Each of the moving nozzles may be a turning type nozzle to be turned around a predetermined turning axis as shown in FIG. 3, or may be a direct-acting type nozzle to be linearly moved in the direction in which the corresponding arm extends unlike the example shown in FIG. 3.

The first moving nozzle 31 and the second moving nozzle 32 may be arranged to be movable also in the vertical direction.

The chemical liquid discharged from the first moving nozzle 31 contains, for example, hydrogen peroxide solution ($H_2O_2$), hydrofluoric acid (HF), dilute hydrofluoric acid (DHF), buffered hydrofluoric acid (BHF), hydrochloric acid (HCl), HPM solution (hydrochloric acid-hydrogen peroxide mixture), SPM solution (sulfuric acid/hydrogen peroxide mixture), ammonia water, TMAH solution (tetramethylammonium hydroxide solution), or APM solution (ammonia-hydrogen peroxide mixture).

Hydrofluoric acid, dilute hydrofluoric acid, buffered hydrofluoric acid, hydrochloric acid, HPM solution, and SPM solution are classified into an acidic chemical liquid. Ammonia water, APM solution, and TMAH solution are classified into an alkaline chemical liquid.

The chemical liquid may be a liquid containing at least one of hydrogen peroxide solution, hydrofluoric acid, dilute hydrofluoric acid, buffered hydrofluoric acid, hydrochloric acid, HPM solution, and SPM solution. The chemical liquid may be a liquid containing at least one of ammonia water, APM solution, and TMAH solution.

The rinse liquid discharged from the first moving nozzle 31 is, for example, water such as DIW (deionized water). However, the rinse liquid is not limited to DIW. The rinse liquid is not limited to DIW but is a liquid containing at least one of DIW, carbonated water, electrolyzed ion water, hydrochloric acid water of dilute concentration (of, for example, not less than 1 ppm and not more than 100 ppm), ammonia water of dilute concentration (of, for example, not less than 1 ppm and not more than 100 ppm), and regenerated water (hydrogen water).

The first moving nozzle 31 is connected to a common pipe 40 that guides the fluid to the first moving nozzle 31. A chemical liquid pipe 41 that supplies the chemical liquid to the common pipe 40 and a rinse liquid pipe 42 that supplies the rinse liquid to the common pipe 40 are connected to the common pipe 40. The common pipe 40 may be connected to the chemical liquid pipe 41 and the rinse liquid pipe 42 via mixing valves (not shown).

A common valve 50 that opens/closes the common pipe 40 is provided in the common pipe 40. A chemical liquid valve 51 that opens/closes the chemical liquid pipe 41 is provided in the chemical liquid pipe 41. A rinse liquid valve 52 that opens/closes the rinse liquid pipe 42 is provided in the rinse liquid pipe 42.

Although not shown in the figures, the common valve 50 includes a valve body inside which a valve seat is provided, a valve element that opens/closes the valve seat, and an actuator that moves the valve element between an open position and a close position. The other valves have the same arrangement.

When the chemical valve 51 and the common valve 50 are opened, the continuous flow of the chemical liquid is discharged from the first moving nozzle 31. When the rinse liquid valve 52 and the common valve 50 are opened, the continuous flow of the rinse liquid is discharged from the first moving nozzle 31.

The organic solvent discharged from the second moving nozzle 32 is, for example, isopropanol (IPA) but not limited to this.

The organic solvent discharged from the second moving nozzle 32 includes ethanol (EtOH), alcohol such as isopropanol, ethylene glycol monoalkyl ether such as ethylene glycol monomethyl ether and ethylene glycol monoethyl ether, ethylene glycol monoalkyl ether acetate such as ethylene glycol monomethyl ether acetate and ethylene glycol monoethyl ether acetate, propylene glycol monoalkyl ether such as propylene glycol monomethyl ether (PGME) and propylene glycol monoethyl ether (PGEE), lactic acid ester such as methyl lactate and ethyl lactate (EL), aromatic hydrocarbon such as toluene and xylene, and keton such as methyl ethyl ketone, 2-heptanone, and cyclohexanone. As an organic solvent contained in a hydrophilic membrane forming liquid as a solvent, propylene glycol monomethyl ether acetate (PGMEA) can also be used. Each of the organic solvents can be used alone or two or more organic solvents can be mixed and used.

An organic solvent pipe 43 that supplies the organic solvent to the second moving nozzle 32 is connected to the second moving nozzle 32. An organic solvent valve 53 that opens/closes the organic solvent pipe 43 is provided in the organic solvent pipe 43. When the organic solvent valve 53 is opened, the continuous flow of the organic solvent is discharged from the second moving nozzle 32.

The processing liquid supplied to the upper surface of the substrate W is scattered from the peripheral edge portion of the substrate W and received by the processing cup 8. The processing liquid received by the processing cup 8 is collected or discarded by a drain pipe (not shown).

In accordance with a type of the processing liquid supplied to the upper surface of the substrate W, a substance contained in the atmosphere which is discharged from the chamber 4 is changed. In detail, when the chemical liquid is supplied to the upper surface of the substrate W, vapor and a mist of the chemical liquid are contained in the atmosphere discharged from the chamber 4 (chemical liquid atmosphere). When the organic solvent is supplied to the upper surface of the substrate W, vapor and a mist of the organic solvent are contained in the atmosphere discharged from the chamber 4 (organic solvent atmosphere). In substrate processing to be described later (see FIG. 9 to be described later), the rinse liquid is supplied to the substrate W after the chemical liquid. Therefore, the atmosphere discharged from the chamber 4 before a fixed time passes after supply of the rinse liquid to the upper surface of the substrate W is started is the chemical liquid atmosphere.

There may be a case that the chemical liquid atmosphere discharged from the chamber 4 does not contain the mist of the chemical liquid. Similarly, there may be a case that the organic solvent atmosphere discharged from the chamber 4 does not contain the mist of the organic solvent.

<Arrangement of Discharge Unit According to First Embodiment>

Figure 4:
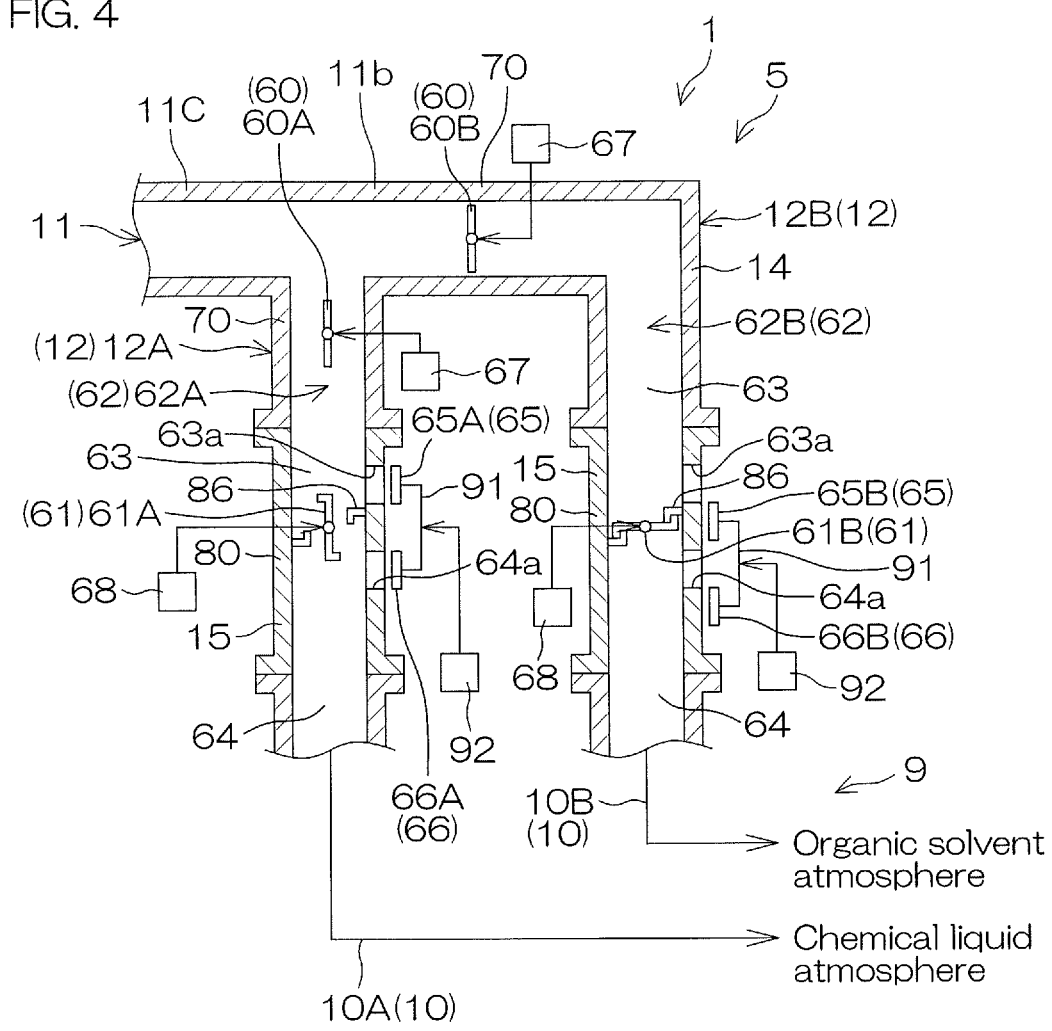
FIG. 4 is a schematic diagram for describing an arrangement of a discharge unit provided in the substrate processing apparatus.

FIG. 4 is a schematic diagram for describing an arrangement of the discharge unit 5. Hereinafter, one of the plurality of discharge units 5 will be focused and described. In the first preferred embodiment, an example that two branch pipes 12 are provided for each of the discharge units 5 will be described.

The two branch pipes 12 include a first branch pipe 12A that discharges the chemical liquid atmosphere, and a second branch pipe 12B that discharges the organic solvent atmosphere. Each of the branch pipes 12 has an upstream end connected to the downstream end portion 11b of the main pipe 11, and a downstream end connected to a corresponding discharge duct 10. Each of the branch pipes 12 has an internal space 62 into which the atmosphere from the main pipe 11 can flow.

The same number of discharge ducts 10 as the branch pipes 12 are provided, and the atmosphere in each of the branch pipes 12 is discharged to the corresponding discharge duct 10. The discharge duct 10 connected to the first branch pipe 12A is called the first discharge duct 10A, and the discharge duct 10 connected to the second branch pipe 12B is called the second discharge duct 10B.

Each of the entire branch pipes 12 may be integrated with the main pipe 11, or may be formed as a separate body from the main pipe 11 and mechanically bonded to the main pipe 11. In the present preferred embodiment, the branch pipe 12 includes an integrated portion 14 integrated with the main pipe 11, and a separate body portion 15 mechanically bonded to the integrated portion 14 by bonding members (not shown) such as screws. The separate body portion 15 is formed by mechanically bonding a plurality of pipe members by bonding members (not shown) such as screws.

The discharge unit 5 includes a plurality of upstream dampers 60, a plurality of downstream dampers 61, a plurality of upstream slide dampers 65, and a plurality of downstream slide dampers 66.

One each of the upstream dampers 60 is provided for each of the branch pipes 12. Each of the upstream dampers 60 opens/closes the corresponding branch pipe 12. In detail, the upstream damper 60 opens/closes a flow path arranged by the internal space 62 of the corresponding branch pipe 12. An atmosphere is prohibited from flowing into the downstream side of the upstream damper 60 from the upstream side of the upstream damper 60 by closing the branch pipe 12 using the upstream damper 60. The upstream damper 60 is, for example, a butterfly damper.

Among the plurality of upstream dampers 60, the upstream damper 60 provided in the first branch pipe 12A may be called the first upstream damper 60A, and the upstream damper 60 provided in the second branch pipe 12B may be called the second upstream damper 60B.

One each of the downstream dampers 61 is provided for each of the branch pipes 12. Each of the downstream dampers 61 is positioned on the downstream side of the upstream damper 60 in the corresponding branch pipe 12. Each of the downstream dampers 61 opens/closes the corresponding branch pipe 12. In detail, the downstream damper 61 opens/closes a branch flow path arranged by the internal space 62 of the corresponding branch pipe 12. An atmosphere is prohibited from flowing into the downstream side of the downstream damper 61 from the upstream side of the downstream damper 61 by closing the branch pipe 12 using the downstream damper 61. The downstream damper 61 is, for example, a butterfly damper.

Among the plurality of downstream dampers 61, the downstream damper 61 provided in the first branch pipe 12A may be called the first downstream damper 61A, and the downstream damper 61 provided in the second branch pipe 12B may be called the second downstream damper 61B.

The internal space 62 includes an upstream space 63 on the downstream side of the upstream damper 60 and on the upstream side of the downstream damper 61, and a downstream space 64 on the downstream side of the downstream damper 61. Each of the branch pipe 12 has an upstream opening 63a connecting the upstream space 63 and a space around the branch pipe 12 (exterior of the branch pipe 12), and a downstream opening 64*a* connecting the downstream space 64 and the space around the branch pipe 12 (exterior of the branch pipe 12).

The upstream space 63 communicates with the space around the branch pipe 12 via the upstream opening 63*a*. The downstream space 64 communicates with the space around the branch pipe 12 via the downstream opening 64*a*.

Among the internal spaces 62 of the plurality of branch pipes 12, the internal space 62 of the first branch pipe 12A may be called the first internal space 62A and the internal space 62 of the second branch pipe 12B may be called the second internal space 62B.

The upstream slide damper 65 is arranged to open the upstream opening 63*a* to cause the atmosphere around the branch pipe 12 to flow into the upstream space 63, and close the upstream opening 63*a* to stop an inflow of the atmosphere around the branch pipe 12 to the upstream space 64.

The downstream slide damper 66 is arranged to open the downstream opening 64*a* to cause the atmosphere around the branch pipe 12 to flow into the downstream space 64, and close the downstream opening 64*a* to stop an inflow of the atmosphere around the branch pipe 12 to the downstream space 64.

In the present preferred embodiment, the atmosphere around the branch pipe 12 may be called the external atmosphere. The external atmosphere is an atmosphere flowing into the upstream space 63 from a different route from the main pipe 11. The upstream slide damper 65 is an example of an upstream opening/closing damper that opens/closes the upstream opening 63*a*. The downstream slide damper 66 is an example of a downstream opening/closing damper that opens/closes the downstream opening 64*a*.

Among the plurality of upstream slide dampers 65, the upstream slide damper 65 provided in the first branch pipe 12A may be called the first upstream slide damper 65A, and the upstream slide damper 65 provided in the second branch pipe 12B may be called the second upstream slide damper 65B.

Among the plurality of downstream slide dampers 66, the downstream slide damper 66 provided in the first branch pipe 12A may be called the first downstream slide damper 66A, and the downstream slide damper 66 provided in the second branch pipe 12B may be called the second downstream slide damper 66B. In a case where the opening to be opened/closed by the slide damper has a slit shape, the slide damper may also be called a slit damper.

By opening/closing the branch pipe 12 by the upstream damper 60, it is possible to switch the discharge destination of the atmosphere in the chamber 4. In detail, as shown in FIG. 4, by opening one of the branch pipes 12 (for example, the first branch pipe 12A) and closing the other branch pipe 12 (for example, the second branch pipe 12B), it is possible to make one of the branch pipes 12 the discharge destination of the atmosphere in the chamber 4. By closing the branch pipe 12 by the downstream damper 61, it is possible to suppress an inflow of the atmosphere from the main pipe 11 to the branch pipe 12 which is not the discharge destination.

By causing the external atmosphere to flow into the downstream space 64 by the downstream slide damper 66 corresponding to the branch pipe 12 which is not the discharge destination of the atmosphere, it is possible to feed the external atmosphere toward the downstream of the corresponding branch pipe 12. Therefore, it is possible to prevent a change in discharge amount of the atmosphere from the branch pipe 12 due to closing of the branch pipe 12 by the upstream damper 60.

Figure 5A:
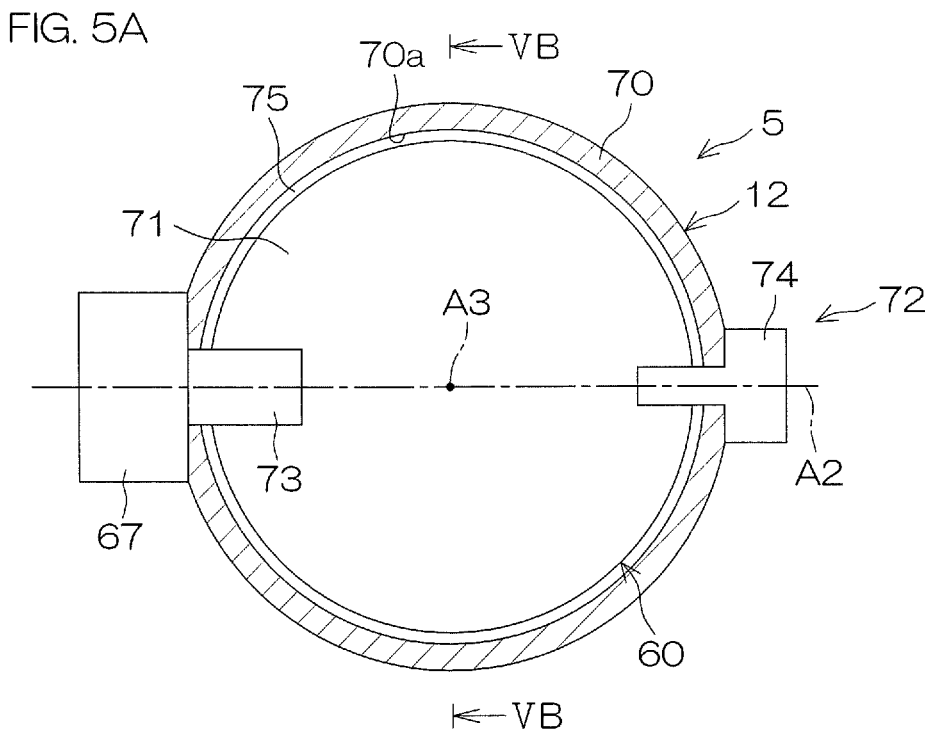
FIG. 5A is a schematic diagram for describing an arrangement of an upstream damper provided in the discharge unit.
Figure 5B:
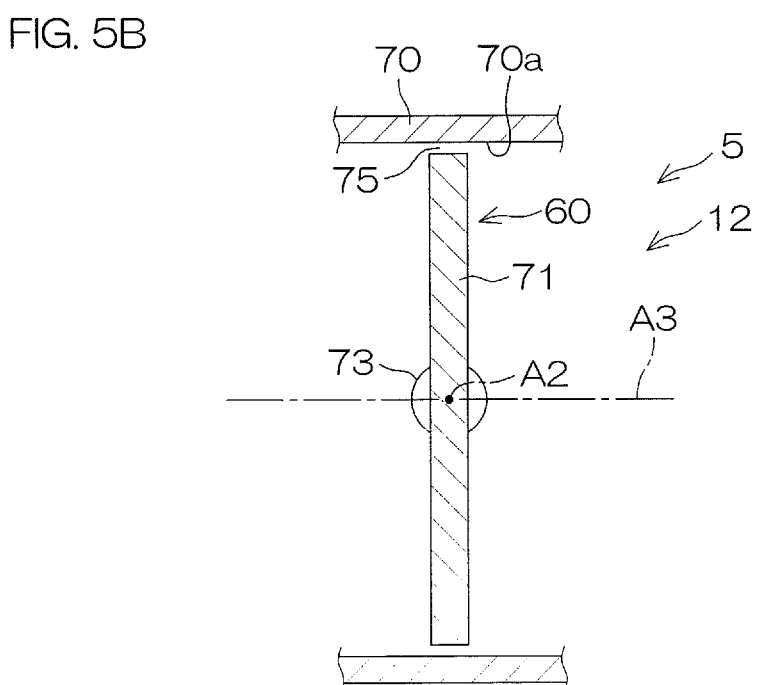
FIG. 5B is a cross-sectional view taken along line VB-VB shown in FIG. 5A.

FIG. 5A is a schematic diagram for describing an arrangement of the upstream damper 60. FIG. 5B is a cross-sectional view taken along line VB-VB shown in FIG. 5A.

The branch pipe 12 has an upstream tubular portion 70 at a position where the upstream damper 60 is provided. The upstream tubular portion 70 has an upstream inner peripheral surface 70*a* having a circular shape in a cross-sectional view. The upstream damper 60 includes an upstream valve element 71 having a shape along the upstream inner peripheral surface 70*a*, that is, a disk shape, and an upstream valve element rotating mechanism 72 that rotates the upstream valve element 71 in the branch pipe 12.

The upstream valve element rotating mechanism 72 includes an upstream rotating shaft 73 that transmits a rotational force to the upstream valve element 71, and an upstream support shaft 74 that is disposed coaxially to the upstream rotating shaft 73 on the opposite side of the upstream rotating shaft 73 with respect to the upstream valve element 71 and rotatably supports the upstream valve element 71.

The upstream valve element 71 is rotated around an upstream rotational axis A2 which is a central axis of the upstream rotating shaft 73 together with the upstream rotating shaft 73 and the upstream support shaft 74. The upstream rotational axis A2 is orthogonal to an upstream valve element central axis A3 which is a central axis of the upstream valve element 71. The upstream valve element 71 opens/closes the branch pipe 12 by being rotated around the upstream rotational axis A2 in the branch pipe 12. In a state where the upstream damper 60 (upstream valve element 71) closes the branch pipe 12, the upstream valve element central axis A3 of the upstream valve element 71 coincides with a central axis of the upstream inner peripheral surface 70*a*. In a state where the upstream damper 60 (upstream valve element 71) closes the branch pipe 12, an upstream gap 75 exists between the upstream valve element 71 and the upstream inner peripheral surface 70*a*.

The discharge unit 5 further includes an upstream damper driving mechanism 67 that drives the upstream damper 60 and causes the upstream damper 60 to open/close the branch pipe 12. The upstream damper driving mechanism 67 can drive the upstream valve element 71 via the upstream rotating shaft 73, and move the upstream valve element 71 between a close position where the upstream valve element 71 closes the branch pipe 12 and an open position where the upstream valve element 71 opens the branch pipe 12. The upstream damper driving mechanism 67 includes, for example, an actuator such as an electric motor or an air cylinder.

By adopting the butterfly damper as the upstream damper 60, it is possible to close the branch pipe 12 by a simple arrangement. By providing the gap (upstream gap 75) between the upstream inner peripheral surface 70*a* of the branch pipe 12 and the upstream valve element 71, it is possible to smoothly rotate the upstream valve element 71 in the branch pipe 12.

Figure 6A:
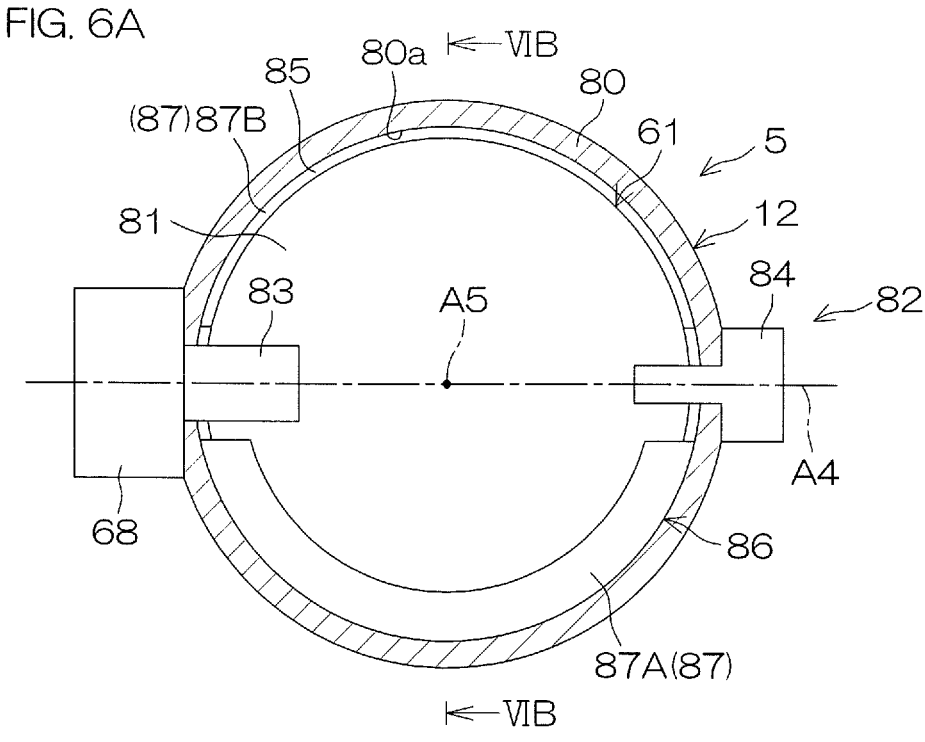
FIG. 6A is a schematic diagram for describing an arrangement of a downstream damper provided in the discharge unit.
Figure 6B:
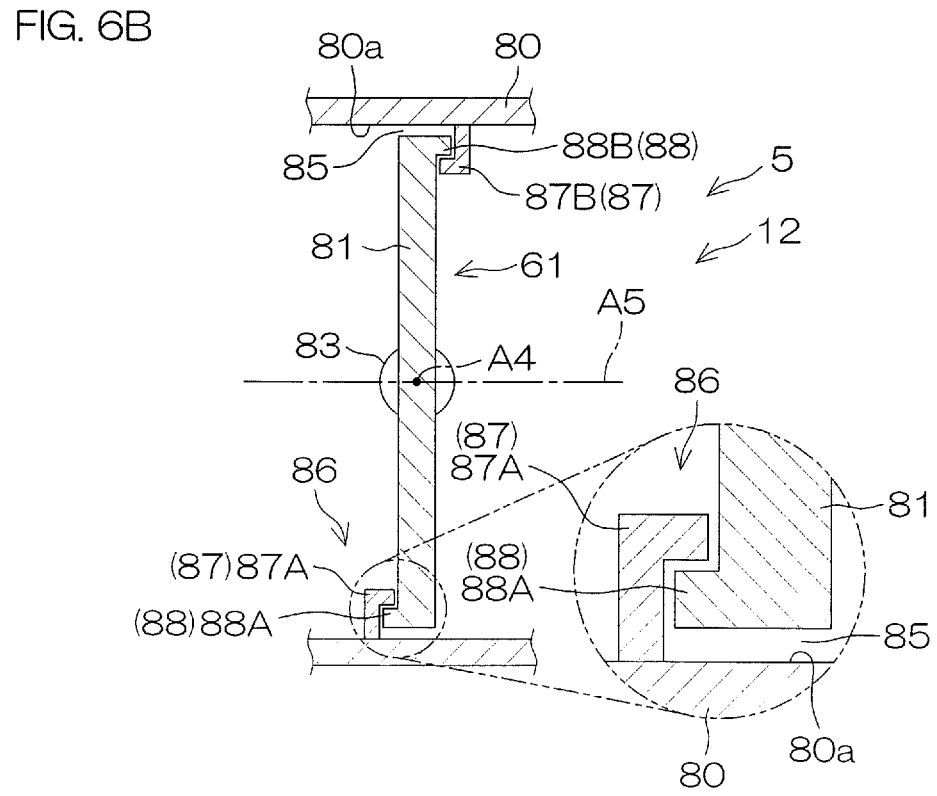
FIG. 6B is a cross-sectional view taken along line VIB-VIB shown in FIG. 6A.

FIG. 6A is a schematic diagram for describing an arrangement of the downstream damper 61. FIG. 6B is a cross-sectional view taken along line VIB-VIB shown in FIG. 6A.

The branch pipe 12 has a downstream tubular portion 80 at a position where the downstream damper 61 is provided. The downstream tubular portion 80 has a downstream inner peripheral surface 80*a* having a circular shape in a cross-sectional view. The downstream damper 61 includes a downstream valve element 81 having a shape along the downstream inner peripheral surface 80*a*, that is, a disk shape, and a downstream valve element rotating mechanism 82 that rotates the downstream valve element 81 in the branch pipe 12.

The downstream valve element rotating mechanism 82 includes a downstream rotating shaft 83 that transmits a rotational force to the downstream valve element 81, and a downstream support shaft 84 that is disposed coaxially to the downstream rotating shaft 83 on the opposite side of the downstream rotating shaft 83 with respect to the downstream valve element 81 and rotatably supports the downstream valve element 81.

The downstream valve element 81 is rotated around a downstream rotational axis A4 which is a central axis of the downstream rotating shaft 83 together with the downstream rotating shaft 83 and the downstream support shaft 84. The downstream rotational axis A4 is orthogonal to a downstream valve element central axis A5 which is a central axis of the downstream valve element 81. The downstream valve element 81 opens/closes the branch pipe 12 by being rotated around the downstream rotational axis A4 in the branch pipe 12.

In a state where the downstream damper 61 (downstream valve element 81) closes the branch pipe 12, the downstream valve element central axis A5 of the downstream valve element 81 coincides with a central axis of the downstream inner peripheral surface 80a. In a state where the downstream damper 61 (downstream valve element 81) closes the branch pipe 12, a downstream gap 85 exists between the downstream valve element 81 and the downstream inner peripheral surface 80a.

The discharge unit 5 further includes a downstream damper driving mechanism 68 that drives the downstream damper 61 and causes the downstream damper 61 to open/close the branch pipe 12. The downstream damper driving mechanism 68 can drive the downstream damper 61 via the downstream rotating shaft 83, and move the downstream damper 61 between a close position where the downstream damper 61 closes the branch pipe 12 and an open position where the downstream damper 61 opens the branch pipe 12. The downstream damper driving mechanism 68 includes, for example, an actuator such as an electric motor or an air cylinder.

By adopting the butterfly damper as the downstream damper 61, it is possible to close the branch pipe 12 by a simple arrangement. By providing the gap (downstream gap 85) between the downstream inner peripheral surface 80a of the branch pipe 12 and the downstream valve element 81, it is possible to smoothly rotate the downstream valve element 81 in the branch pipe 12.

The discharge unit 5 includes a sealing structure 86 that seals a space between the downstream inner peripheral surface 80a and the downstream valve element 81 in a state where the downstream valve element 81 closes the branch pipe 12. The sealing structure 86 is, for example, a labyrinth seal structure that contactlessly seals the portion between the downstream inner peripheral surface 80a and the downstream valve element 81. The labyrinth seal structure is a structure in which two members are convexo-concave-engaged in a state where a slight gap is provided between the front surfaces of the members. The convexo-concave engagement means fitting of a convex portion and a concave portion. Therefore, the downstream damper 61 has a higher sealing property than the upstream damper 60, and it is possible to effectively suppress passage of the atmosphere in comparison with the upstream damper 60.

By providing the sealing structure 86, it is possible to further suppress the atmosphere from passing through the downstream damper 61 while providing the gap (downstream gap 85) between the downstream inner peripheral surface 80a of the branch pipe 12 and the downstream valve element 81 so that the downstream valve element 81 can be smoothly rotated.

The sealing structure 86 includes a plurality of valve element seal members 88 that have a substantially semi-arc shape which extends in the circumferential direction of the downstream valve element 81 and is provided in a peripheral edge portion of the downstream valve element 81, and a plurality of pipe seal members 87 that have a substantially semi-arc shape which extends in the circumferential direction of the downstream inner peripheral surface 80a and is provided on the downstream inner peripheral surface 80a.

The plurality of pipe seal members 87 are contactlessly convexo-concave-engaged with the plurality of valve element seal members 88 respectively in a state where the downstream valve element 81 is positioned at the close position.

One end portion of each of the valve element seal members 88 in the circumferential direction of the downstream valve element 81 is spaced from the downstream rotating shaft 83, and the other end portion of each of the valve element seal members 88 in the circumferential direction of the downstream valve element 81 is spaced from the downstream support shaft 84.

The plurality of valve element seal members 88 include a first valve element seal member 88A and a second valve element seal member 88B. The first valve element seal member 88A is provided on one of a pair of circular surfaces of the downstream valve element 81. The second valve element seal member 88B is provided on the other circular surface of the downstream valve element 81. The first valve element seal member 88A and the second valve element seal member 88B have a rotation symmetrical shape with which the valve element seal members overlap each other when one of the first valve element seal member 88A and the second valve element seal member 88B is rotated around the downstream rotational axis A4 by 180 degrees.

One end portion of each of the pipe seal members 87 in the circumferential direction of the downstream inner peripheral surface 80a is spaced from the downstream rotating shaft 83, and the other end portion of each of the pipe seal members 87 in the circumferential direction of the downstream inner peripheral surface 80a is spaced from the downstream support shaft 84.

The plurality of pipe seal members 87 include a first pipe seal member 87A opposing the first valve element seal member 88A in the axial direction of the downstream inner peripheral surface 80a in a state where the downstream valve element 81 is positioned at the close position, and a second pipe seal member 87B opposing the second valve element seal member 88B in the axial direction of the downstream inner peripheral surface 80a in a state where the downstream valve element 81 is positioned at the close position.

The first pipe seal member 87A and the second pipe seal member 87B have a rotation symmetrical shape with which the pipe seal members overlap each other when one of the first pipe seal member 87A and the second pipe seal member 87B is rotated around the downstream rotational axis A4 by 180 degrees. Therefore, it is possible to dispose the downstream valve element 81 at the close position by rotating the downstream valve element 81 to one side around the downstream rotational axis A4, and dispose the downstream valve element 81 at the open position by rotating the downstream valve element 81 to the other side around the downstream rotational axis A4.

That is, by simple rotation actions, it is possible to switch to a state where the portion between the downstream inner peripheral surface 80*a* of the branch pipe 12 and the downstream valve element 81 is sealed by the sealing structure 86, and switch to a state where the portion between the downstream inner peripheral surface 80*a* of the branch pipe 12 and the downstream valve element 81 is not sealed.

Unlike the structure shown in FIGS. 6A and 6B, the sealing structure 86 may be a contact type sealing structure 86 in which the plurality of valve element seal members 88 and the plurality of pipe seal members 87 are brought into contact with each other.

Figure 7:
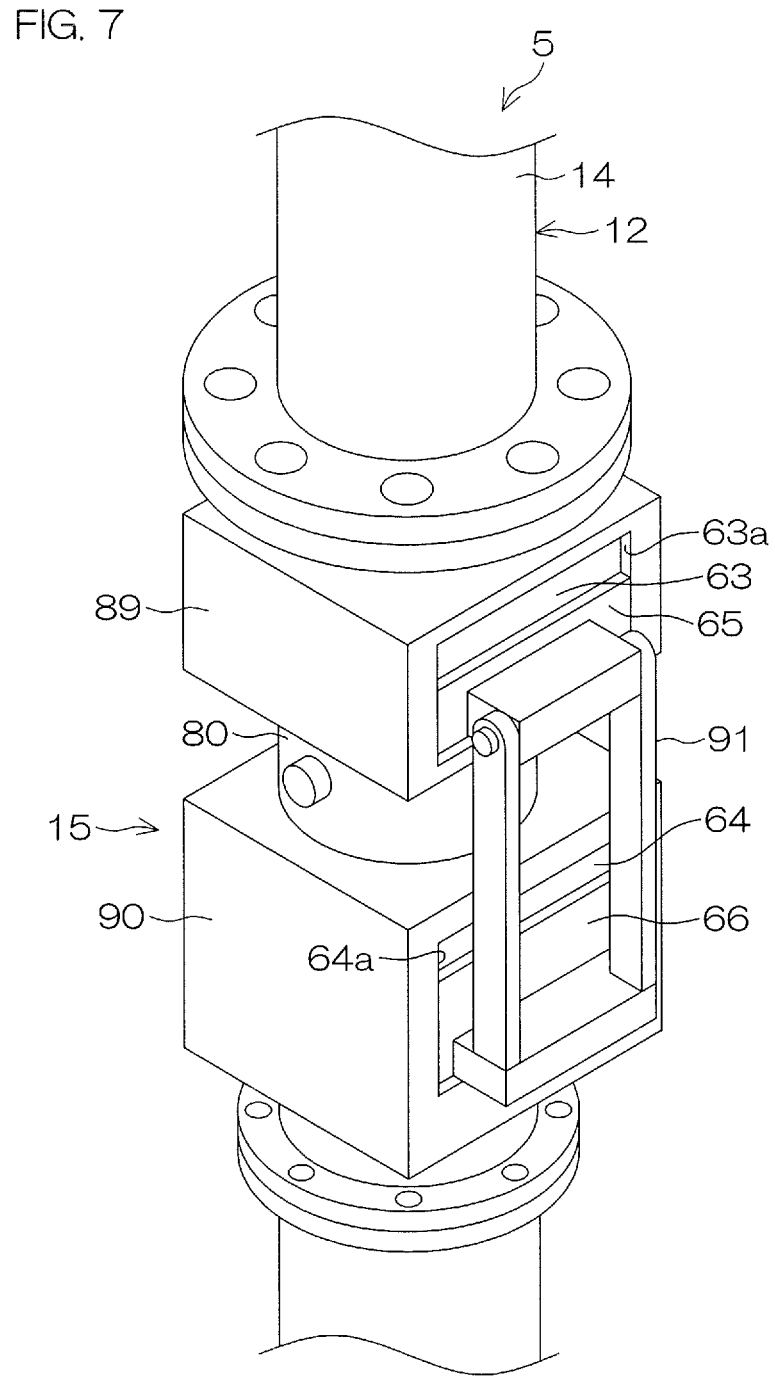
FIG. 7 is a schematic diagram for describing arrangements of an upstream slide damper and a downstream slide damper provided in the discharge unit.

FIG. 7 is a schematic diagram for describing arrangements of the upstream slide damper 65 and the downstream slide damper 66.

Each of the branch pipes 12 includes an upstream box-shaped portion 89 that has a square shape in a cross-sectional view and is positioned on the downstream side of the upstream tubular portion 70 and on the upstream side of the downstream tubular portion 80, and a downstream box-shaped portion 90 positioned on the downstream side of the downstream tubular portion 80. The upstream opening 63*a* penetrates through a flat wall portion of the upstream box-shaped portion 89, and the downstream opening 64*a* penetrates through a flat wall portion of the downstream box-shaped portion 90. In the present preferred embodiment, a single pipe member is arranged by the upstream box-shaped portion 89, the downstream box-shaped portion 90, and the upstream tubular portion 70.

By sliding with respect to the branch pipe 12, the upstream slide damper 65 opens/closes the upstream opening 63*a*. By sliding with respect to the branch pipe 12, the downstream slide damper 66 opens/closes the downstream opening 64*a*.

The discharge unit 5 further includes a coupling member 91 that couples the upstream slide damper 65 and the downstream slide damper 66, and a slide driving mechanism 92 that causes the upstream slide damper 65 and the downstream slide damper 66 to slide by driving the coupling member 91 (see FIG. 4). The slide driving mechanism 92 includes, for example, an actuator such as an air cylinder or an electric motor.

The upstream slide damper 65 is moved to a closing position to close the upstream opening 63*a*, an opening position to open the upstream opening 63*a*, and a position between the positions by the slide driving mechanism 92. The upstream slide damper 65 is moved, for example, along a guide provided in an edge portion of the upstream opening 63*a*.

By causing the upstream slide damper 65 to slide with respect to the branch pipe 12 and opening the upstream opening 63*a*, it is possible to cause the external atmosphere to flow into the upstream space 63 from the exterior of the branch pipe 12. With the sliding type damper, there is no need for connecting pipes, etc., for causing the external atmosphere to flow into the upstream space 63 to the branch pipe 12. Thus, it is possible to simplify the arrangement.

The upstream slide damper 65 can switch the state of the upstream space 63 between an inflow permitted state where the upstream space 63 permits the inflow of the external atmosphere and an inflow prohibited state where the upstream space 63 prohibits the inflow of the external atmosphere. Therefore, the upstream slide damper 65 is an example of an upstream switching member.

The statement "the state of the upstream space 63 can be switched between the inflow permitted state and the inflow prohibited state" means that the state of the upstream space 63 can be switched from the inflow permitted state to the inflow prohibited state and the state of the upstream space 63 can be switched from the inflow prohibited state to the inflow permitted state.

The downstream slide damper 66 is moved to a closing position to close the downstream opening 64*a*, an opening position to open the downstream opening 64*a*, and a position between the positions by the slide driving mechanism 92. The downstream slide damper 66 is moved, for example, along a guide provided in an edge portion of the downstream opening 64*a*.

By causing the downstream slide damper 66 to slide with respect to the branch pipe 12 and opening the downstream opening 64*a*, it is possible to cause the external atmosphere to flow into the downstream space 64 from the exterior of the branch pipe 12. With the sliding type damper, there is no need for connecting pipes, etc., for causing the external atmosphere to flow into the downstream space 64 to the branch pipe 12. Thus, it is possible to simplify the arrangement.

The downstream slide damper 66 can switch the state of the downstream space 64 between an inflow permitted state where the downstream space 64 permits the inflow of the external atmosphere and an inflow prohibited state where the downstream space 64 prohibits the inflow of the external atmosphere. Therefore, the downstream slide damper 66 is an example of a downstream switching member.

The statement "the state of the downstream space 64 can be switched between the inflow permitted state and the inflow prohibited state" means that the state of the downstream space 64 can be switched from the inflow permitted state to the inflow prohibited state and the state of the downstream space 64 can be switched from the inflow prohibited state to the inflow permitted state.

With the discharge unit 5 of the first preferred embodiment, the downstream damper 61 is provided on the downstream side of the upstream slide damper 65. Therefore, by opening the upstream opening 63*a* by the upstream slide damper 65 and causing the external atmosphere to flow into the upstream space 63, it is possible to increase pressure of the upstream space 63. Atmospheric pressure around the branch pipe 12 may be equal to atmospheric pressure of the upstream space 63 or may be higher or lower than the atmospheric pressure of the upstream space 63.

In detail, by making the pressure of the upstream space 63 higher than pressure of a space in the main pipe 11, it is possible to suppress an inflow of the atmosphere to the upstream space 63 from the upstream gap 75 between the upstream inner peripheral surface 70*a* and the upstream valve element 71. Thereby, it is possible to effectively suppress the inflow of the atmosphere from the chamber 4 to the branch pipe 12 which is not the discharge destination of the atmosphere from the chamber 4. A state where the pressure of the upstream space 63 becomes higher than the pressure of the space in the main pipe 11 is called a positive pressure state. Therefore, the upstream slide damper 65 is also called a barometric damper.

The atmosphere flows back toward the main pipe 11 from the upstream space 63, and the flow-back atmosphere may flow into the branch pipe 12 as the discharge destination. Almost all the flow-back atmosphere is composed of the external atmosphere. Thus, even when the flow-back atmosphere flows into the branch pipe 12 as the discharge destination, the discharge duct 10 is hardly influenced.

By increasing the pressure of the upstream space 63, it is possible to suppress the atmosphere discharged from the chamber 4 from flowing into the unintended branch pipe 12. Consequently, while the atmosphere is flowing into one branch pipe 12 among the plurality of branch pipes 12 from the chamber 4, it is possible to effectively suppress the atmosphere from the chamber 4 from flowing into the other branch pipe 12.

With the discharge unit 5 according to the first preferred embodiment, in a state where the inflow of the atmosphere discharged from the chamber 4 to the branch pipe 12 is sufficiently suppressed by the upstream damper 60, a major part of the atmosphere flowing to the downstream side of the downstream damper 61 through the downstream gap 85 is composed of the external atmosphere flowing into the upstream space 63 via the upstream opening 63a.

Therefore, even in a case where the downstream gap 85 exists between an inner peripheral surface of the branch pipe 12 and the downstream valve element 81, in comparison to the upstream damper 60, there is a lower possibility that the atmosphere discharged from the chamber 4 passes through the downstream gap 85. Therefore, while suppressing the atmosphere discharged from the chamber 4 from flowing to the downstream side of the branch pipe 12, it is possible to smoothly rotate the downstream valve element 81 in the branch pipe 12.

With the discharge unit 5 according to the first preferred embodiment, in a state where the downstream valve element 81 closes the branch pipe 12, the portion between the downstream inner peripheral surface 80a and the downstream valve element 81 is sealed by the sealing structure 86. Therefore, it is possible to promptly and sufficiently increase the pressure of the upstream space 63 of the branch pipe 12.

The downstream valve element 81 is positioned on the upstream side of the downstream slide damper 66. Therefore, even in a state where the branch pipe 12 is closed by the upstream damper 60 and the downstream damper 61, it is possible to feed the external atmosphere to the discharge duct 10.

In addition, with the discharge unit 5 according to the first preferred embodiment, the upstream slide damper 65 and the downstream slide damper 66 are coupled by the coupling member 91. Therefore, it is possible to drive the coupling member 91 and cause both the upstream slide damper 65 and the downstream slide damper 66 to slide with respect to the branch pipe 12 at the same time. Thereby, it is possible to open/close the upstream opening 63a and the downstream opening 64a at the same time. Therefore, in comparison to an arrangement that opening/closing of the upstream slide damper 65 and opening/closing of the downstream slide damper 66 are performed by using separate driving mechanisms, it is possible to simplify the arrangement for causing the slide dampers to slide.

Figure 8:
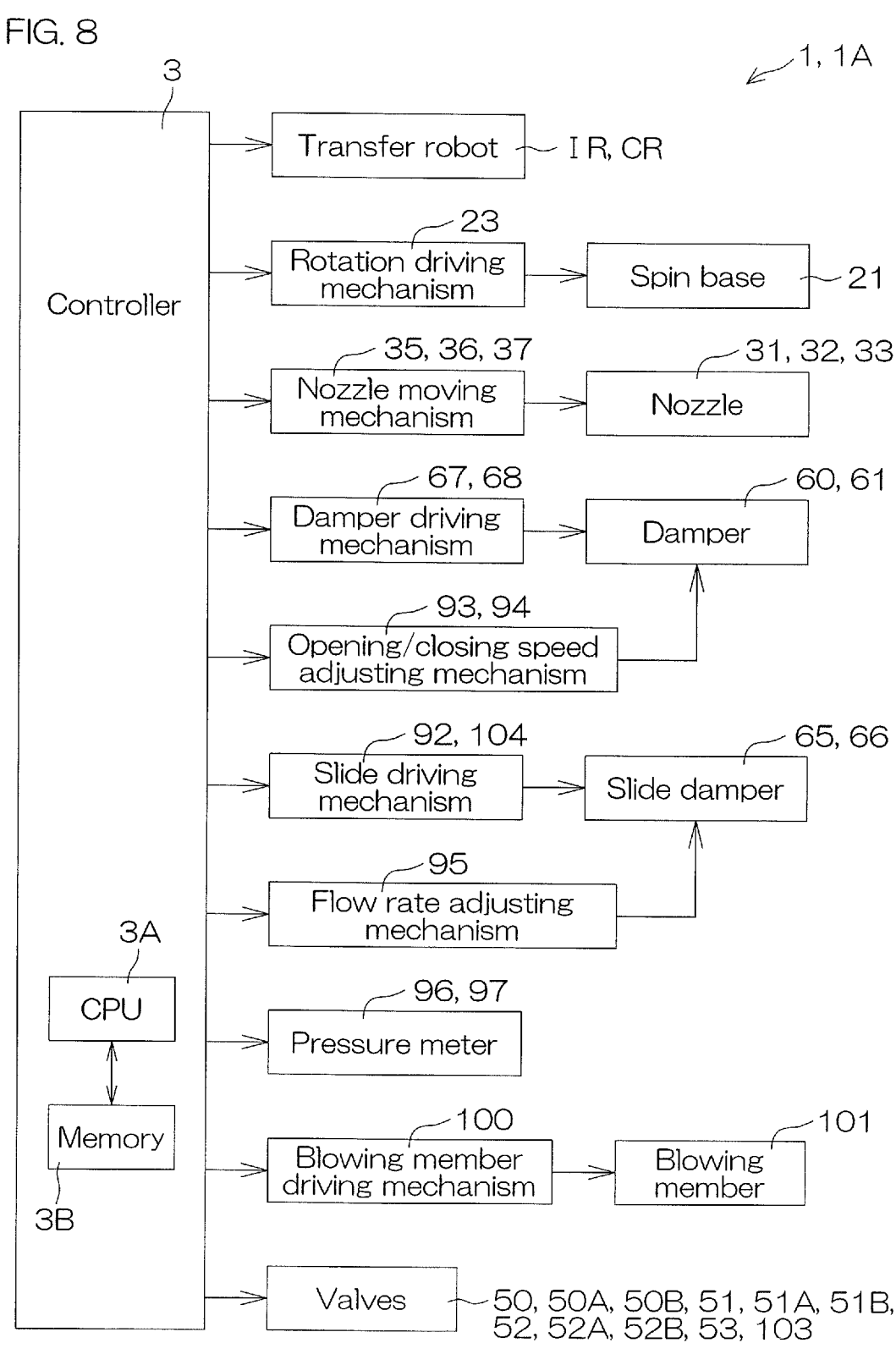
FIG. 8 is a block diagram for describing an electrical arrangement of the substrate processing apparatus.

FIG. 8 is a block diagram for describing an arrangement example related to controls of the substrate processing apparatus 1. The controller 3 includes a microcomputer, and controls objects to be controlled provided in the substrate processing apparatus 1 according to a predetermined control program.

Specifically, the controller 3 includes a processor 3A (CPU), and a memory 3B in which the control program is stored. The controller 3 is arranged to execute various controls for the substrate processing by the processor 3A executing the control program.

In particular, the controller 3 is programmed to control the first transfer robot IR, the second transfer robot CR, the rotation driving mechanism 23, the first nozzle moving mechanism 35, the second nozzle moving mechanism 36, the upstream damper driving mechanism 67, the downstream damper driving mechanism 68, the slide driving mechanism 92, the common valve 50, the chemical liquid valve 51, the rinse liquid valve 52, the organic solvent valve 53, etc.

By controlling the valves by the controller 3, execution and stop of discharge of the fluids from the corresponding nozzles, and a discharge flow rate of the fluids from the corresponding nozzles are controlled. By controlling the upstream damper driving mechanism 67 by the controller 3, it is possible to control opening/closing of the upstream damper 60. By controlling the downstream damper driving mechanism 68 by the controller 3, it is possible to control opening/closing of the downstream damper 61. By controlling the slide driving mechanism 92 by the controller 3, it is possible to control opening/closing of the upstream slide damper 65 and the downstream slide damper 66.

The steps shown below are executed by controlling each of the members provided in the substrate processing apparatus 1 by the controller 3. In other words, the controller 3 is programmed to execute the steps shown below.

Although FIG. 8 shows representative members, it does not mean that members not shown in the figure are not controlled by the controller 3. The controller 3 can properly control each of the members provided in the substrate processing apparatus 1. FIG. 8 also shows members described in modified examples and a second preferred embodiment to be described later, and the members are also controlled by the controller 3.

<Example of Substrate Processing>

Figure 9:
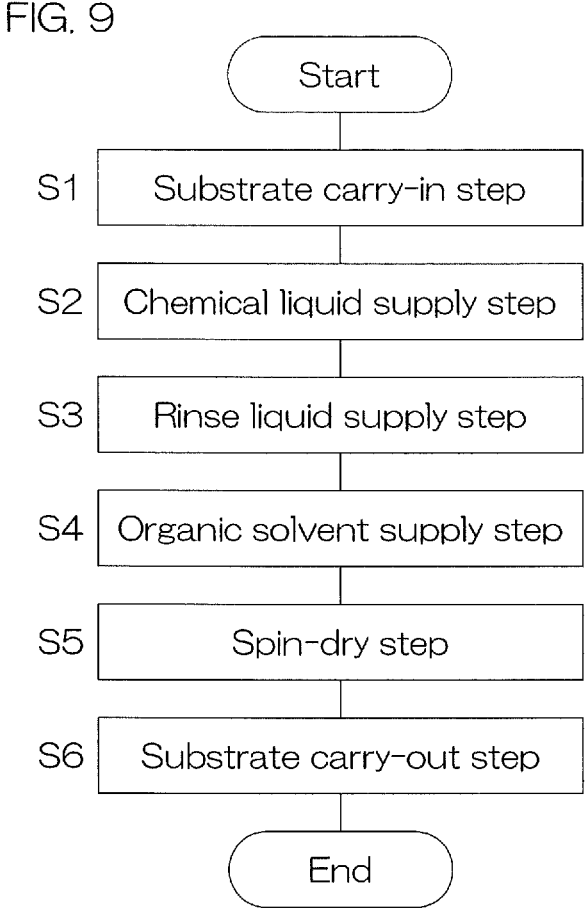
FIG. 9 is a flowchart for describing an example of substrate processing by the substrate processing apparatus.

FIG. 9 is a flowchart for describing an example of the substrate processing to be executed by the substrate processing apparatus 1. FIG. 9 mainly shows processing realized by executing the program by the controller 3.

In the substrate processing by the substrate processing apparatus 1, for example, as shown in FIG. 9, a substrate carry-in step (Step S1), a chemical liquid supply step (Step S2), a rinse liquid supply step (Step S3), an organic solvent supply step (Step S4), a spin-dry step (Step S5), and a substrate carry-out step (Step S6) are executed in this order. Hereinafter, details of the substrate processing will be described mainly with reference to FIGS. 2, 3, and 9.

First, the unprocessed substrate W is carried into the processing unit 2 by the second transfer robot CR (see FIG. 1A), and handed over to the spin chuck 13 (substrate carry-in step: Step S1). Thereby, the substrate W is horizontally held by the spin chuck 13 (substrate holding step). In a state where the substrate W is held by the spin chuck 13, the rotation driving mechanism 23 starts rotation of the substrate W (substrate rotation step). The substrate W continues to be held by the spin chuck 13 until the spin-dry step (Step S5) is ended.

After the second transfer robot CR is retreated out of the processing unit 2, the chemical liquid supply step (Step S2) of supplying the chemical liquid to the upper surface of the substrate W is executed. Specifically, the first nozzle moving mechanism 35 moves the first moving nozzle 31 and causes the first moving nozzle 31 to oppose the upper surface of the substrate W. By opening the common valve 50 and the chemical liquid valve 51 in this state, the continuous flow of the chemical liquid is discharged (supplied) toward the upper surface of the substrate W from the first moving nozzle 31 (chemical liquid discharge step, chemical liquid supply step). Thereby, the upper surface of the substrate W is processed by the chemical liquid.

After the chemical liquid supply step (Step S2), the rinse liquid supply step (Step S3) of supplying the rinse liquid to the upper surface of the substrate W is executed. Specifically, while maintaining a state where the first moving nozzle 31 opposes the upper surface of the substrate W and the common valve 50 is opened, the chemical liquid valve 51 is closed and the rinse liquid valve 52 is opened. Thereby, discharge of the chemical liquid from the first moving nozzle 31 is stopped. Further, the continuous flow of the rinse liquid is discharged (supplied) toward the upper surface of the substrate W from the first moving nozzle 31 (rinse liquid discharge step, rinse liquid supply step). Thereby, the chemical liquid on the upper surface of the substrate W is discharged out of the substrate W together with the rinse liquid, and the upper surface of the substrate W is cleaned.

After the rinse liquid supply step (Step S3), the organic solvent supply step (Step S4) of supplying the organic solvent to the upper surface of the substrate W is executed. Specifically, discharge of the rinse liquid from the first moving nozzle 31 is stopped and the first moving nozzle 31 is retreated. By the second nozzle moving mechanism 36, the second moving nozzle 32 opposes the upper surface of the substrate W and the organic solvent valve 53 is opened. Thereby, the continuous flow of the organic solvent is discharged (supplied) toward the upper surface of the substrate W from the second moving nozzle 32 (organic solvent discharge step, organic solvent supply step). Thereby, the rinse liquid on the upper surface of the substrate W is replaced with the organic solvent.

The organic solvent used for the substrate processing preferably has higher volatility than the rinse liquid. If so, by replacing the rinse liquid with the organic solvent, it is possible to favorably dry the substrate W in the subsequent spin-dry step. The organic solvent used for the substrate processing preferably has lower surface tension than the rinse liquid. If so, in a case where convexo-concave patterns are formed on the upper surface of the substrate W, it is possible to reduce surface tension acting on the convexo-concave patterns at the time of drying the upper surface of the substrate W, and to suppress collapse of the convexo-concave patterns.

Next, the spin-dry step (Step S5) of rotating the substrate W at high speed and drying the upper surface of the substrate W is executed. Specifically, the organic solvent valve 53 is closed and supply of the organic solvent to the upper surface of the substrate W is stopped.

The rotation driving mechanism 23 accelerates the rotation of the substrate W and rotates the substrate W at high speed (for example, at 1,500 rpm). Thereby, a large centrifugal force acts on the processing liquids (mainly the organic solvent) attached to the substrate W, and the processing liquids are shaken off to the periphery of the substrate W.

After the spin-dry step (Step S5), the rotation driving mechanism 23 stops the rotation of the substrate W. Thereafter, the second transfer robot CR enters the processing unit 2, receives the processed substrate W from the spin chuck 13, and carries the substrate W out of the processing unit 2 (substrate carry-out step: Step S6).

The substrate W is handed over to the first transfer robot IR from the second transfer robot CR, and stored in the carrier C by the first transfer robot IR. After the processed substrate W is carried out of the processing unit 2, the next unprocessed substrate W is carried into the processing unit 2 by the second transfer robot CR, and the substrate processing on the substrate W is started.

<State of Discharge Unit During Substrate Processing>

Figure 10:
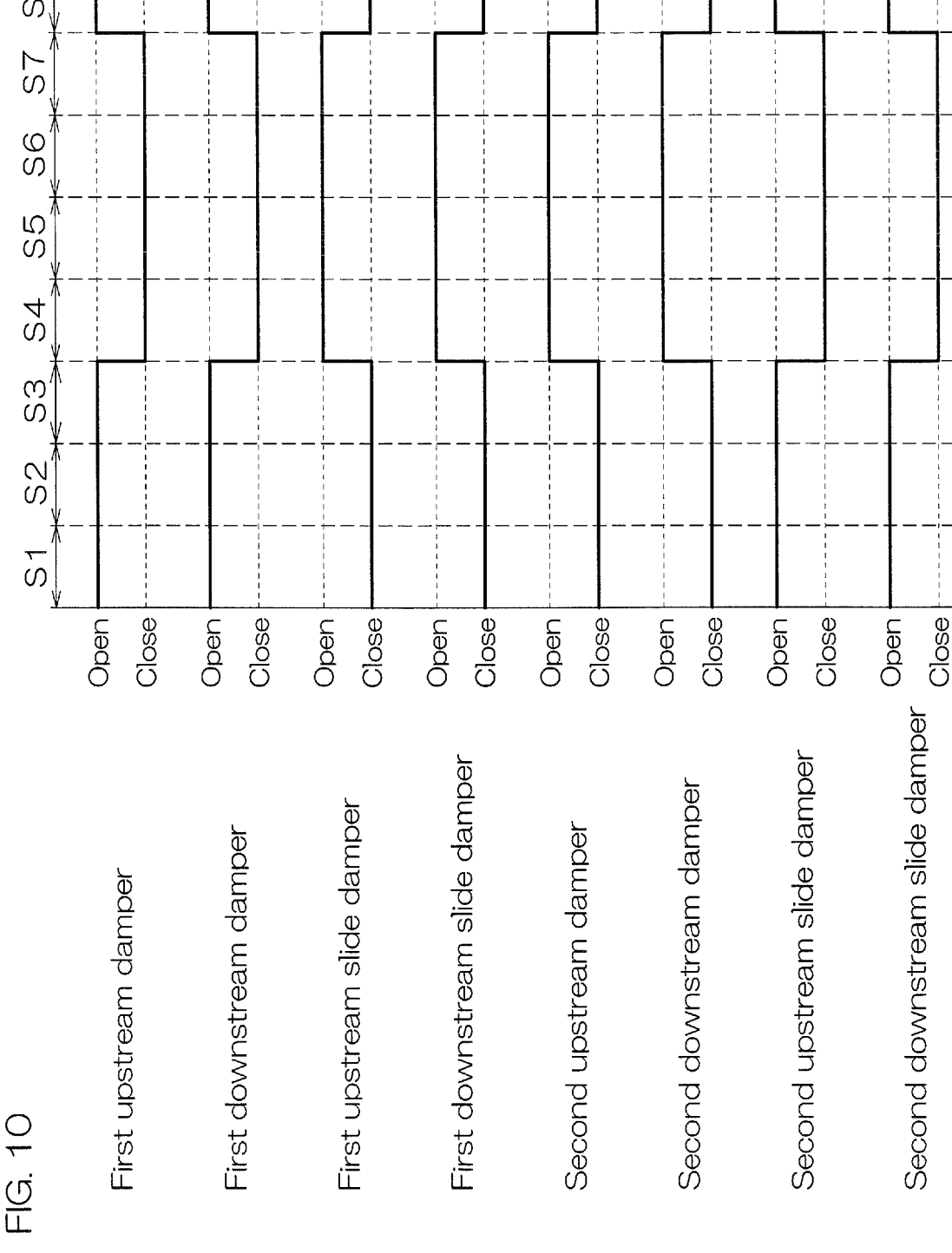
FIG. 10 is a time chart for describing a state of the discharge unit when the substrate processing is performed.
Figure 11A:
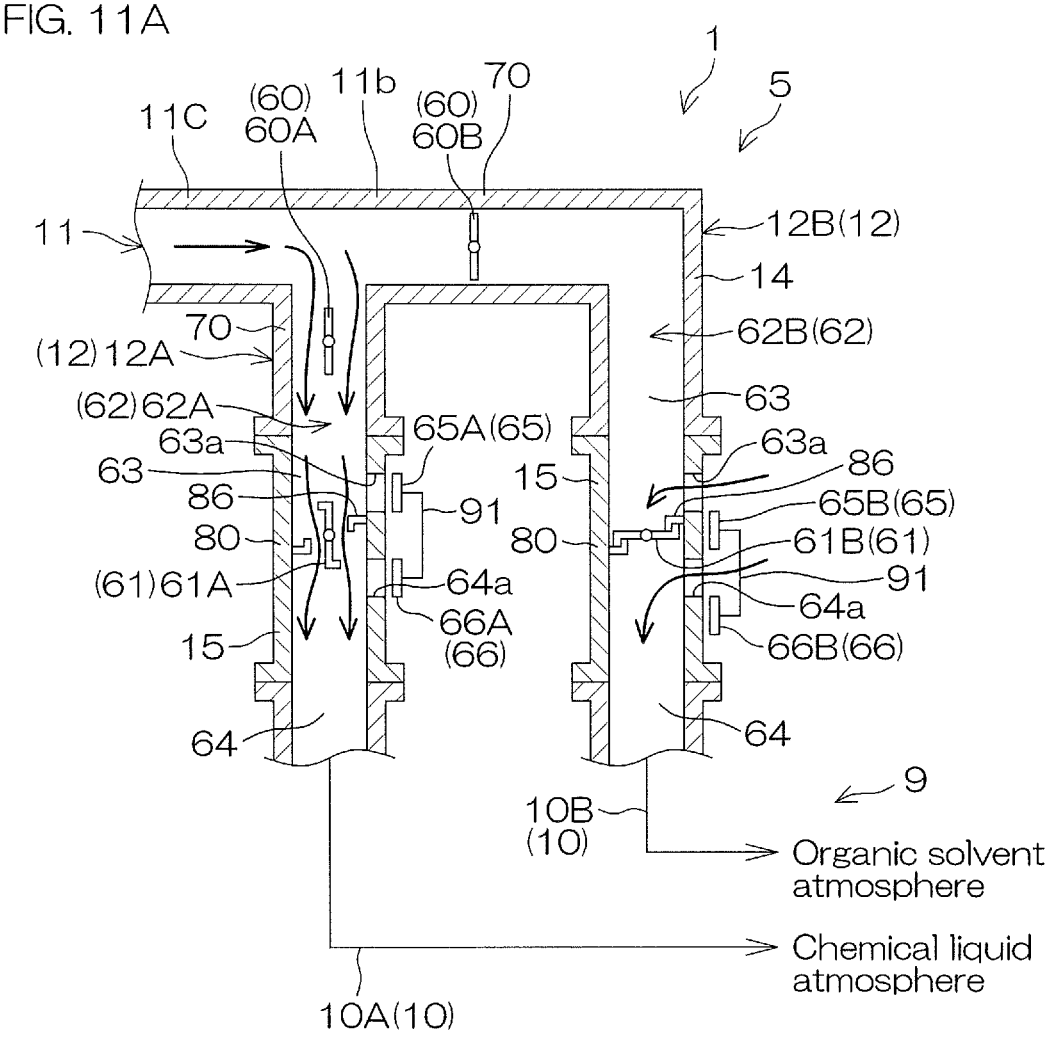
FIG. 11A is a schematic diagram for describing a state of the discharge unit when the substrate processing is performed.
Figures 11B, 12:
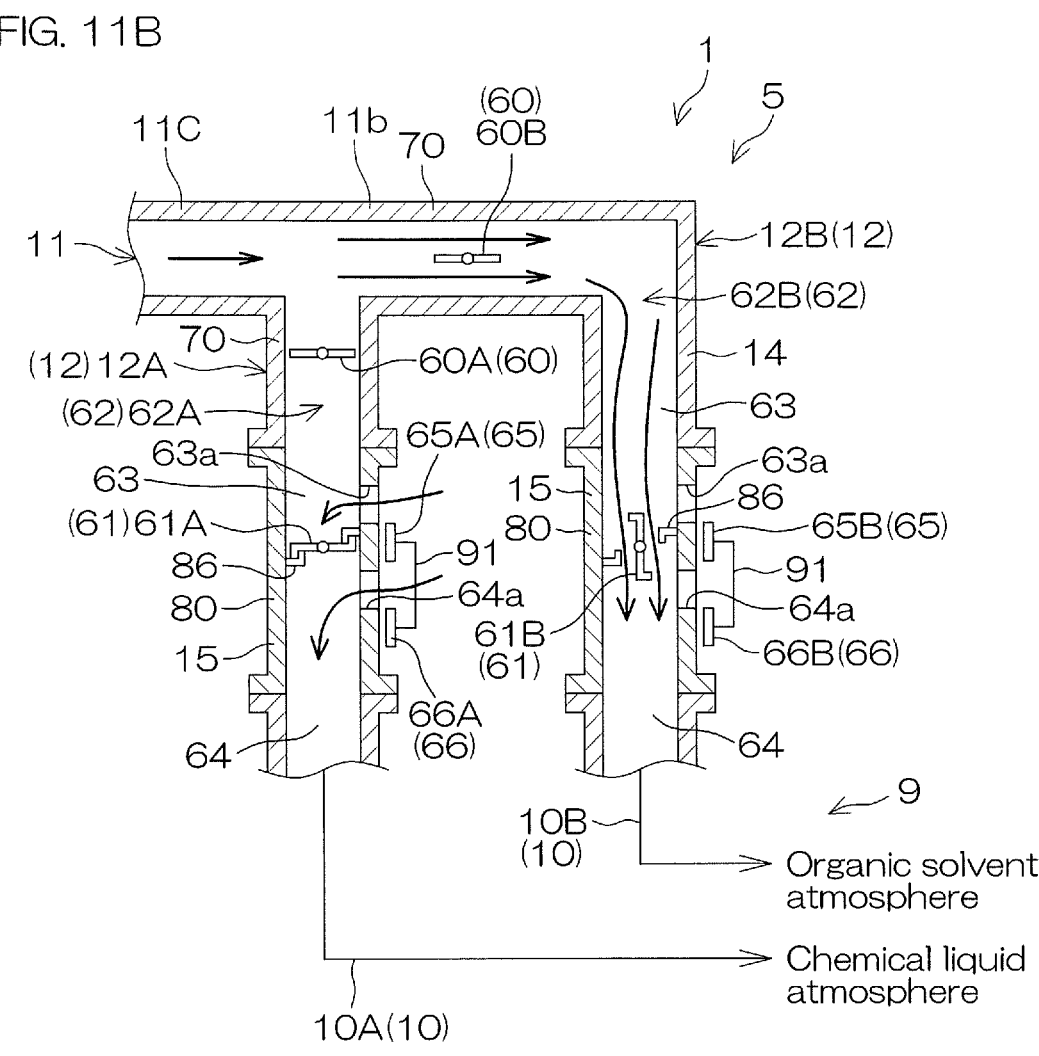
FIG. 11B is a schematic diagram for describing a state of the discharge unit when the substrate processing is performed.
FIG. 12 is a table showing results of simulation in a state of discharge of an atmosphere when a chemical liquid supply step of the substrate processing is performed.

Next, states of the discharge unit 5 during the substrate processing will be described. FIG. 10 is a time chart for describing a state of the discharge unit 5 when the substrate processing is performed. FIGS. 11A and 11B are schematic diagrams for describing states of the discharge unit 5 when the substrate processing is performed.

As shown in FIG. 10, while the chemical liquid supply step (Step S2) and the rinse liquid supply step (Step S3) are executed, the first upstream damper 60A and the first downstream damper 61A are opened, and the first upstream slide damper 65A and the first downstream slide damper 66A are closed. Meanwhile, the second upstream damper 60B and the second downstream damper 61B are closed and the second upstream slide damper 65B and the second downstream slide damper 66B are opened.

Therefore, as shown in FIG. 11A, the chemical liquid atmosphere from the chamber 4 flows into the first branch pipe 12A via the main pipe 11. The atmosphere flowing into the first branch pipe 12A is discharged to the first discharge duct 10A from the first branch pipe 12A.

The atmosphere around the second branch pipe 12B (external atmosphere) flows into the upstream space 63 of the second branch pipe 12B via the upstream opening 63a. Thereby, the pressure of the upstream space 63 of the second branch pipe 12B is increased, and it is possible to suppress an inflow of the chemical liquid atmosphere to the second branch pipe 12B (strictly speaking, to the second internal space 62B). Therefore, it is possible to suppress the chemical liquid atmosphere from mixing into the atmosphere discharged from the second branch pipe 12B.

Meanwhile, the atmosphere around the second branch pipe 12B (external atmosphere) flows into the downstream space 64 of the second branch pipe 12B via the downstream opening 64a. Therefore, even in a state where the inflow of the chemical liquid atmosphere to the second branch pipe 12B from the main pipe 11 is suppressed, it is possible to sufficiently increase a flow rate of the atmosphere discharged to the second discharge duct 10B.

A state where the first branch pipe 12A discharges the atmosphere from the main pipe 11 and the second branch pipe 12B discharges the external atmosphere is called the "chemical liquid atmosphere discharge state." In the example shown in FIG. 10, from the time of starting the substrate carry-in step (Step S1) to the time of ending the rinse liquid supply step (Step S3) (for example, to the time of stopping discharge of the rinse liquid), the chemical liquid atmosphere discharge state is continued.

As shown in FIG. 10, at the time of starting the organic solvent supply step (Step S4) after the rinse liquid supply step (Step S3), the first upstream damper 60A and the first downstream damper 61A are closed and the first upstream slide damper 65A and the first downstream slide damper 66A are opened. Meanwhile, the second upstream damper 60B and the second downstream damper 61B are opened and the second upstream slide damper 65B and the second downstream slide damper 66B are closed.

Therefore, as shown in FIG. 11B, the organic solvent atmosphere from the chamber 4 flows into the second branch pipe 12B via the main pipe 11. The organic solvent atmosphere flowing into the second branch pipe 12B is discharged to the second discharge duct 10B from the second branch pipe 12B.

The atmosphere around the first branch pipe 12A flows into the upstream space 63 of the first branch pipe 12A via the upstream opening 63a. Thereby, the pressure of the upstream space 63 of the first branch pipe 12A is increased, and it is possible to suppress an inflow of the organic solvent atmosphere to the first branch pipe 12A (strictly speaking, to the first internal space 62A). Therefore, it is possible to suppress the organic solvent atmosphere from mixing into the atmosphere discharged from the first branch pipe 12A.

Meanwhile, the atmosphere around the first branch pipe 12A (external atmosphere) flows into the downstream space 64 of the first branch pipe 12A via the downstream opening 64a. Therefore, even in a state where the inflow of the organic solvent atmosphere to the first branch pipe 12A from the main pipe 11 is suppressed, it is possible to sufficiently increase a flow rate of the atmosphere discharged to the first discharge duct 10A.

A state where the second branch pipe 12B discharges the atmosphere from the main pipe 11 and the first branch pipe 12A discharges the external atmosphere is called the "organic solvent atmosphere discharge state." In the example shown in FIG. 10, from the time of starting the organic solvent supply step (Step S4) (for example, from the time of starting discharge of the organic solvent) to start of the substrate carry-in step (Step S1) to the next substrate W, the organic solvent atmosphere discharge state is continued.

As described above, according to the present preferred embodiment, the controller 3 is programmed to switch the branch pipe 12 into which the atmosphere discharged from the main pipe 11 flows in accordance with the type of the processing liquid by controlling the plurality of upstream dampers 60, the plurality of downstream dampers 61, the plurality of upstream slide dampers 65, and the plurality of downstream slide dampers 66. Therefore, it is possible to cause the atmosphere containing a gas and a mist of a proper type of the processing liquid to flow into each of the branch pipes 12.

<Simulation Result of Exhaust>

FIG. 12 is a table showing results of simulation in a state of discharge of the atmosphere when the chemical liquid supply step (Step S2) of the substrate processing is performed.

In the simulation, flow rates of the atmospheres in each of the branch pipes 12 when an ammonia atmosphere serving as an example of the chemical liquid atmosphere is discharged from the first branch pipe 12A was calculated. The entire flow rate of the ammonia atmosphere flowing through the main pipe 11 is 3 m³/min. Example in FIG. 12 represents that simulation was performed by using the discharge unit 5 described above. Reference Example in FIG. 12 represents that simulation was performed by using a discharge unit 5 from which the downstream damper 61 and the sealing structure 86 are eliminated.

The result has been obtained that almost all the ammonia atmosphere flows into the first branch pipe 12A in both Reference Example and Example. However, the result has been obtained that some of the ammonia atmosphere (atmosphere equivalent to 7.43% of the entire ammonia atmosphere) flows into the second branch pipe 12B in Reference Example whereas the ammonia atmosphere does not flow into the second branch pipe 12B in Example.

In detail, the result has been obtained that a flow rate of the atmosphere passing through the second upstream damper 60B is −0.293 m³/min, and a rate of the atmosphere flowing into the second branch pipe 12B with respect to the entire ammonia atmosphere is −9.77%. That is, the result has been obtained that a flow current running from the main pipe 11 to the second branch pipe 12B is not generated and a flow current running from the second branch pipe 12B to the main pipe 11 is generated.

Therefore, the result has been obtained that it is possible to prohibit an inflow of the ammonia atmosphere to the second branch pipe 12B by providing the sealing structure 86 and the second downstream damper 61B and increasing the pressure in the upstream space 63.

<Substrate Processing According to Modified Example>

Figure 13A:
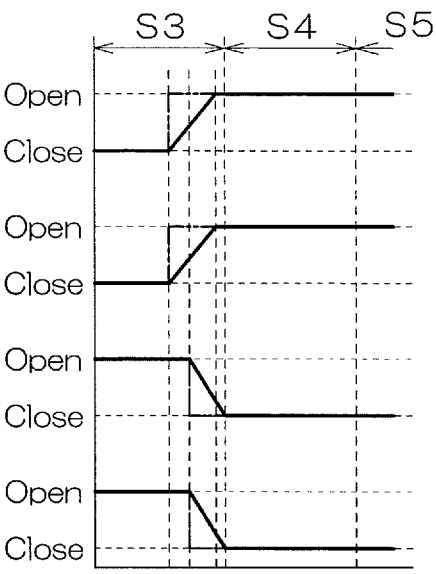
FIG. 13A is a time chart for describing substrate processing according to a modified example.
Figure 13B:
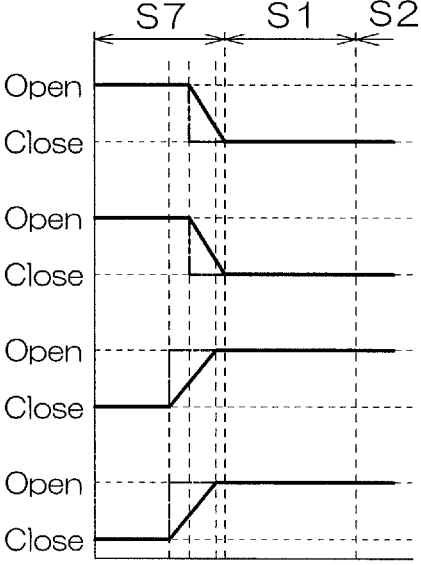
FIG. 13B is a time chart for describing the substrate processing according to the modified example.

FIGS. 13A and 13B are time charts for describing substrate processing according to a modified example. In the substrate processing according to the modified example, opening/closing actions of each of the dampers are performed while gradually changing the opening degrees of the dampers.

In the substrate processing according to the modified example shown in FIG. 13A, before the supply of the rinse liquid is stopped (during execution of the rinse liquid supply step (Step S3)), an action of opening the second upstream slide damper 65B and the second downstream slide damper 66B and an action of closing the second upstream damper 60B and the second downstream damper 61B are started.

Specifically, first, an action of opening the second upstream damper 60B and the second downstream damper 61B is started. Thereby, the second branch pipe 12B is gradually opened. Before the second upstream damper 60B and the second downstream damper 61B are completely opened, an action of closing the second upstream slide damper 65B and the second downstream slide damper 66B is started. Thereby, the upstream opening 63a and the downstream opening 64a of the second branch pipe 12B are gradually closed. When the upstream opening 63a and the downstream opening 64a are completely closed, the supply of the rinse liquid to the substrate W is stopped, and the organic solvent supply step (Step S4) is started.

In the substrate processing according to the modified example shown in FIG. 13B, before supply of the chemical liquid is started (during execution of the substrate carry-out step for the previous substrate W (Step S7)), the action of closing the second upstream damper 60B and the second downstream damper 61B and the action of opening the second upstream slide damper 65B and the second downstream slide damper 66B are started.

Specifically, first, the action of opening the second upstream slide damper 65B and the second downstream slide damper 66B is started. Thereby, the upstream opening 63a and the downstream opening 64a of the second branch pipe 12B are gradually opened. Before the second upstream slide damper 65B and the second downstream slide damper 66B are completely opened, the action of closing the second upstream damper 60B and the second downstream damper 61B is started. Thereby, the second branch pipe 12B is gradually closed. After the second branch pipe 12B is completely opened, the substrate W is carried into the processing unit 2 and the supply of the chemical liquid to the upper surface of the substrate W is started.

Although not shown, the same actions can be performed in the first branch pipe 12A. During the execution of the rinse liquid supply step (Step S3), before an action of closing the first upstream damper 60A and the first downstream damper 61A is started, an action of opening the first upstream slide damper 65A and the first downstream slide damper 66A is started. During the execution of the substrate carry-out step (Step S7), before an action of closing the first upstream slide damper 65A and the first downstream slide damper 66A is started, an action of opening the first upstream damper 60A and the first downstream damper 61A is started.

In such a way, in the substrate processing according to the modified example, in each of the branch pipes 12, before the branch pipe 12 is closed by the upstream damper 60 and the downstream damper 61, the inflow of the external atmosphere to the upstream space 63 and the downstream space 64 is started.

Thereby, it is possible to suppress a state where the upstream damper 60, the downstream damper 61, the upstream slide damper 65, and the downstream slide damper 66 are closed. Thereby, it is possible to suppress the inflow of the atmosphere to the downstream space 64 from remarkably lowering due to closing of the upstream damper 60, the downstream damper 61, the upstream slide damper 65, and the downstream slide damper 66.

Similarly, before the inflow of the external atmosphere to the upstream space 63 and the downstream space 64 is stopped, by opening the branch pipe 12 by the upstream damper 60 and the downstream damper 61, it is also possible to suppress the inflow of the atmosphere to the downstream space 64 from remarkably lowering.

As in the modified example, by gradually changing the opening degrees of each of the dampers, it is possible to suppress a sudden change in flow rate of the atmosphere flowing into the downstream space 64.

As shown in FIG. 13A by double chain lines, even in a case where the opening degrees of each of the dampers are suddenly changed, by opening the branch pipe 12 by the upstream damper 60 and the downstream damper 61 before the inflow of the external atmosphere to the upstream space 63 and the downstream space 64 is stopped, it is possible to suppress the inflow of the atmosphere to the downstream space 64 from remarkably lowering.

Similarly, as shown in FIG. 13B by double chain lines, even in a case where the opening degrees of each of the dampers are suddenly changed, by starting the inflow of the external atmosphere to the upstream space 63 and the downstream space 64 before the upstream damper 60 and the downstream damper 61 are closed, it is possible to suppress the inflow of the atmosphere to the downstream space 64 from remarkably lowering.

<Discharge Unit According to Modified Example>

Next, discharge units 5 according to first to fourth modified examples will be described with reference to FIGS. 14 to 17B.

Figure 14:
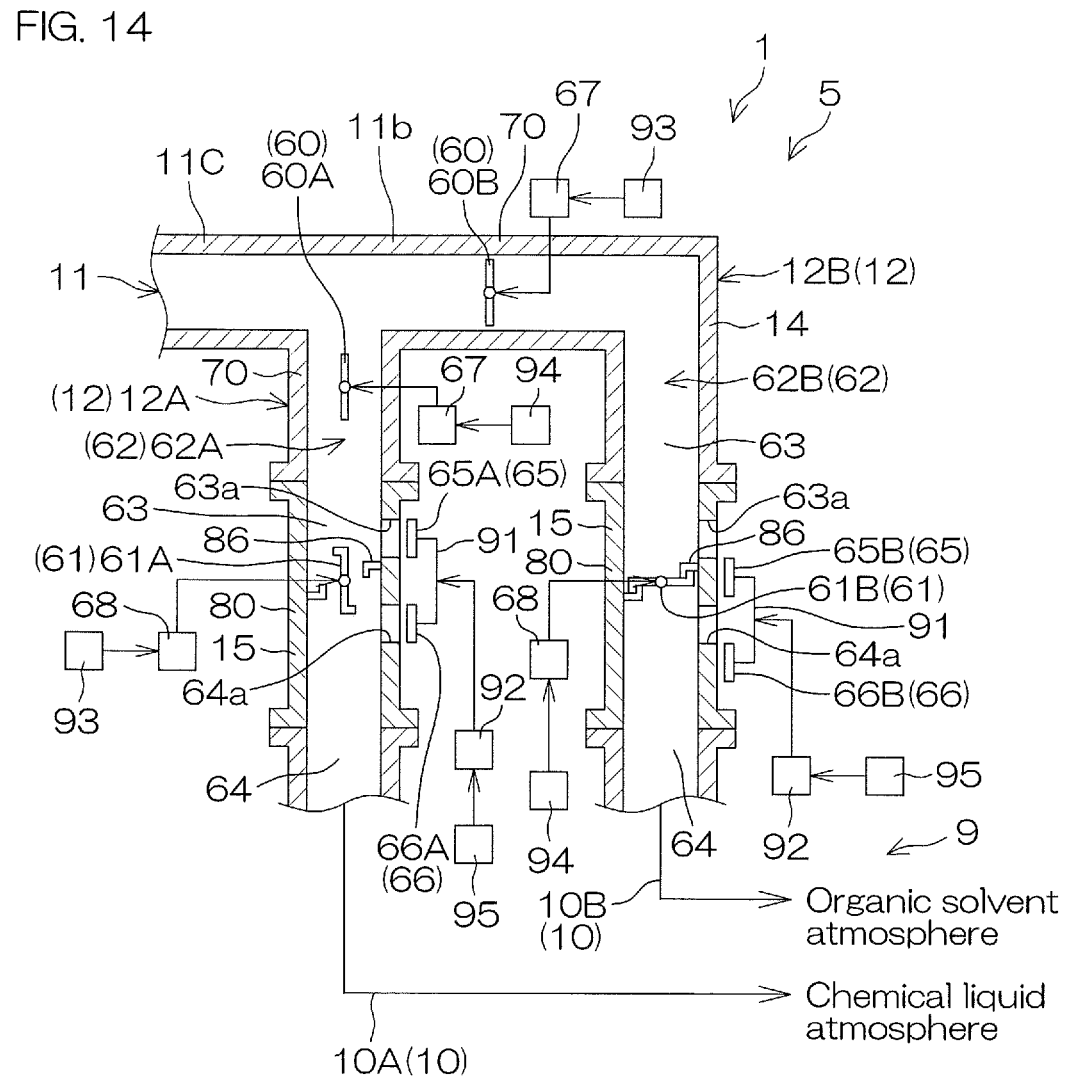
FIG. 14 is a schematic diagram for describing a discharge unit according to a first modified example.

FIG. 14 is a schematic diagram for describing the discharge unit 5 according to the first modified example.

The discharge unit 5 according to the first modified example further includes a plurality of upstream opening/closing speed adjusting mechanisms 93 that respectively adjust opening/closing speed of the plurality of upstream dampers 60, and a plurality of downstream opening/closing speed adjusting mechanisms 94 that respectively adjust opening/closing speed of the plurality of downstream dampers 61.

In a case where the upstream damper driving mechanism 67 includes an air cylinder, each of the upstream opening/closing speed adjusting mechanisms 93 includes a pneumatic control type adjusting mechanism that adjusts action speed of the air cylinder by controlling an amount of the air supplied to the air cylinder. In a case where the upstream damper driving mechanism 67 includes an electric motor, the upstream opening/closing speed adjusting mechanism 93 includes a voltage control type adjusting mechanism that feedback-controls rotation speed of the electric motor. Each of the downstream opening/closing speed adjusting mechanisms 94 includes a pneumatic control type adjusting mechanism or a voltage control type adjusting mechanism, as with the upstream opening/closing speed adjusting mechanism 93.

The discharge unit 5 according to the first modified example further includes a flow rate adjusting mechanism 95 that controls opening/closing actions of the upstream slide damper 65 and the downstream slide damper 66 and adjusts flow rates of the atmospheres flowing into the upstream space 63 and the downstream space 64.

In a case where the slide driving mechanism 92 includes an air cylinder, the flow rate adjusting mechanism 95 includes a pneumatic control type adjusting mechanism that adjusts action speed of the air cylinder by controlling an amount of the air supplied to the air cylinder. In a case where the slide driving mechanism 92 includes an electric motor, the flow rate adjusting mechanism 95 includes a voltage control type adjusting mechanism that feedback-controls rotation speed of the electric motor.

The flow rate adjusting mechanism 95 is an example of a downstream flow rate adjusting mechanism that adjusts the flow rate of the atmosphere flowing into the downstream space 64, and an example of an upstream flow rate adjusting mechanism that adjusts a flow rate of the atmosphere flowing into the upstream space 63.

By adjusting the opening/closing speed of the upstream damper 60 and the downstream damper 61, it is possible to gradually change the flow rate of the atmosphere flowing into the branch pipe 12 from the main pipe 11. By adjusting the flow rate of the external atmosphere flowing into the downstream space 64, it is possible to gradually change a flow rate of the atmosphere discharged from the branch pipe 12. Thereby, it is possible to suppress a sudden change in discharge amount of the atmosphere from the branch pipe 12. Therefore, with the discharge unit 5 according to the first modified example shown in FIG. 14, it is possible to easily realize the substrate processing according to the modified example shown in FIG. 13.

Figure 15:
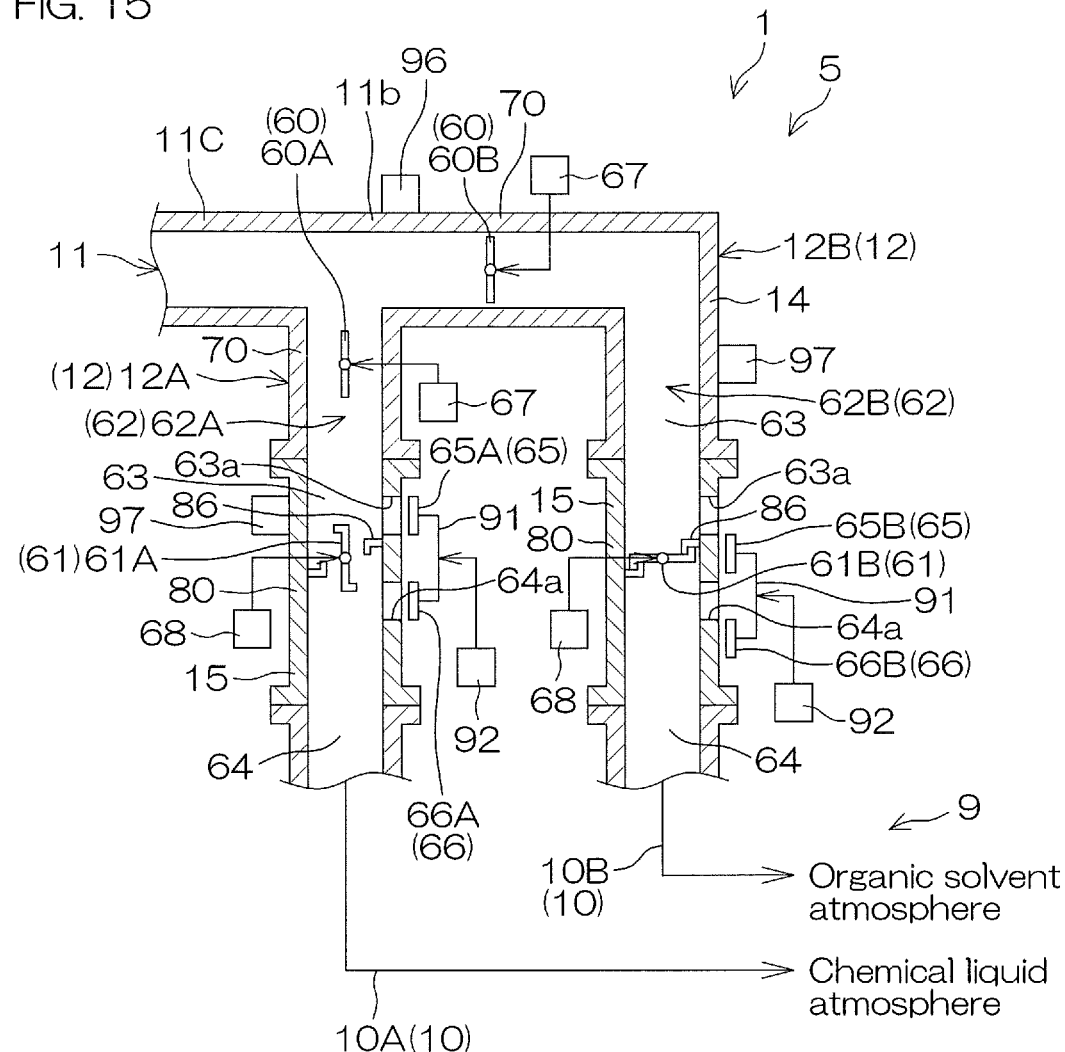
FIG. 15 is a schematic diagram for describing a discharge unit according to a second modified example.

FIG. 15 is a schematic diagram for describing the discharge unit 5 according to the second modified example.

The discharge unit 5 according to the second modified example includes a main pipe pressure meter 96 that measures pressure in the main pipe 11, and a plurality of branch pipe pressure meters 97 that respectively measure pressures of the upstream spaces 63 in the plurality of branch pipes 12.

By measuring the pressure in the main pipe 11 by the main pipe pressure meter 96, it is possible to detect whether discharge of the atmosphere from the chamber 4 is normally performed. That is, it is possible to detect exhaust abnormality (discharge abnormality) of the main pipe 11.

When the pressures of the upstream spaces 63 required for suppressing the inflow of the atmosphere to the upstream spaces 63 from the main pipe 11 are prepared and grasped in advance, it is possible to detect whether the upstream openings 63a are properly opened by measuring the pressures of the upstream spaces 63 of the branch pipes 12 by the branch pipe pressure meters 97.

Figure 16A:
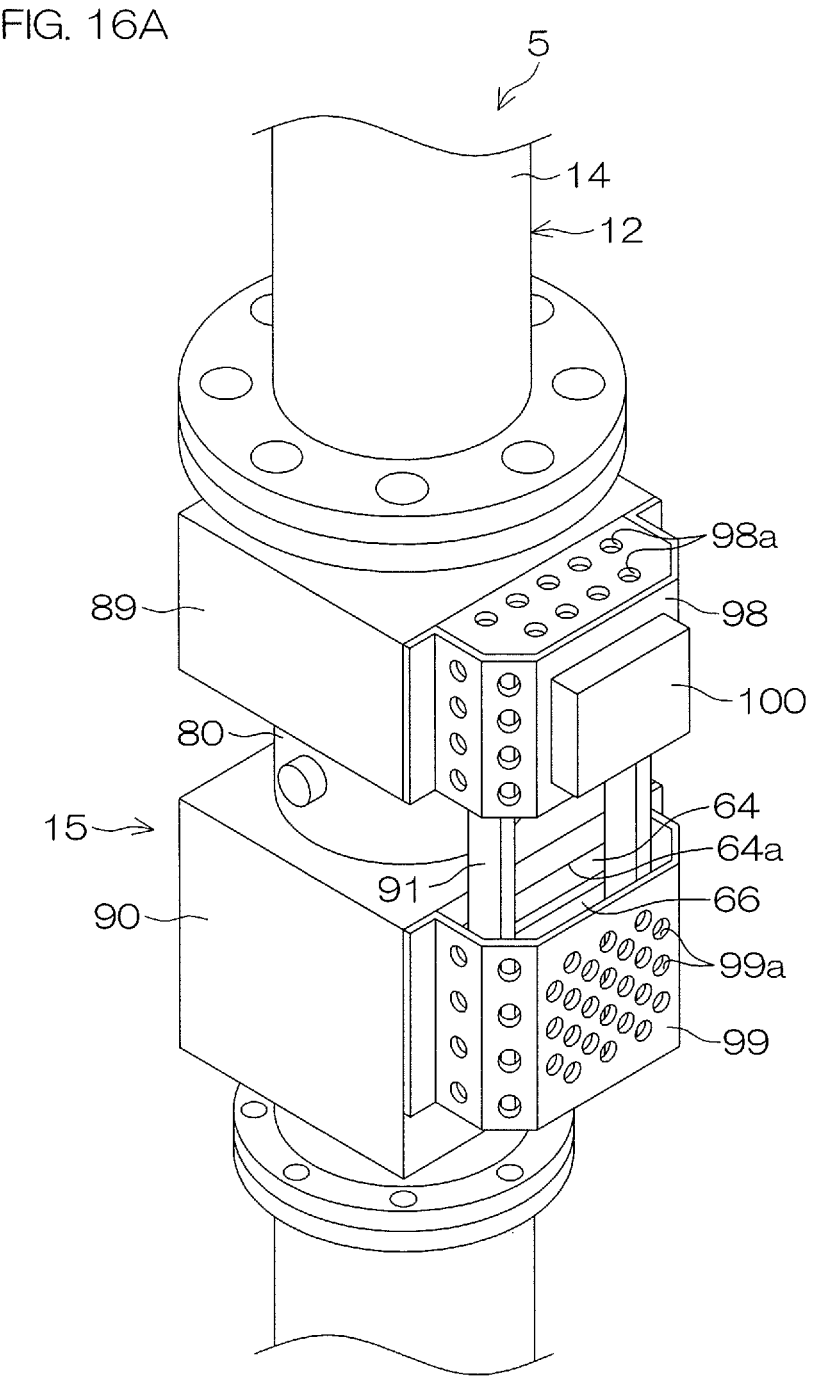
FIG. 16A is a schematic diagram for describing a discharge unit according to a third modified example.
Figure 16B:
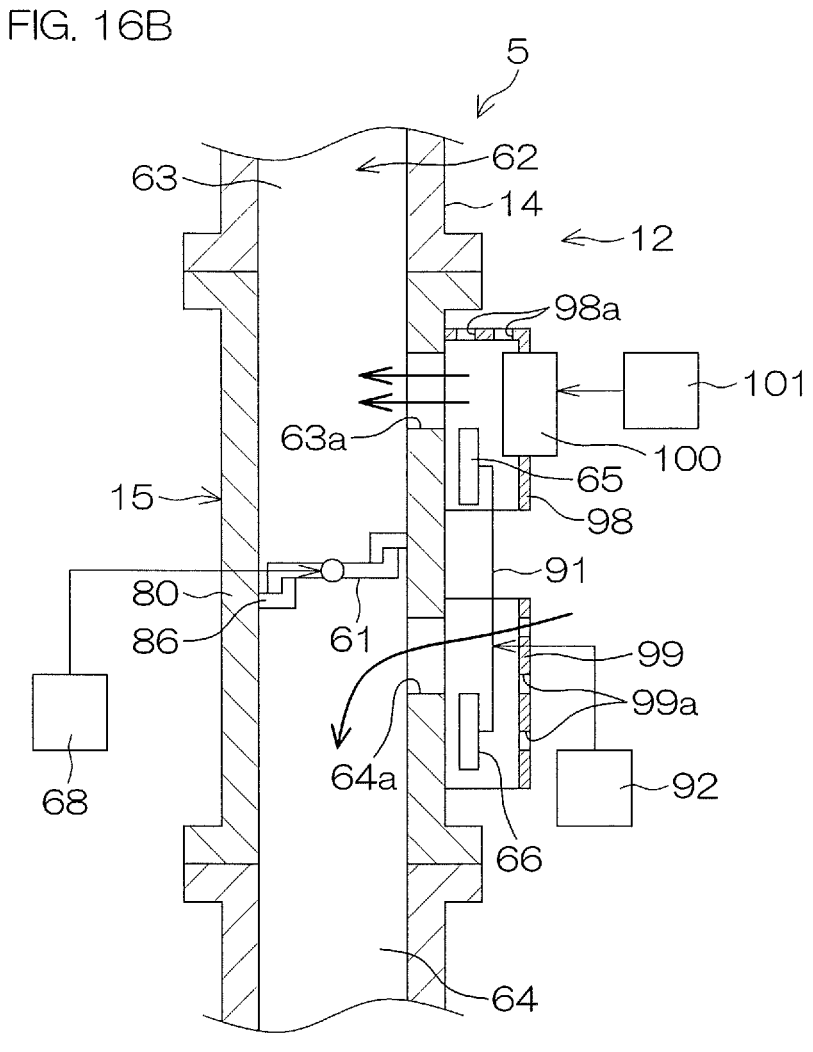
FIG. 16B is a schematic diagram for describing the discharge unit according to the third modified example.

FIG. 16A is a schematic diagram for describing the discharge unit 5 according to the third modified example. FIG. 16B is a schematic diagram for describing the discharge unit 5 according to the third modified example.

The discharge unit 5 according to the third modified example further includes an upstream protecting member 98 that covers the upstream opening 63a and the upstream slide damper 65, a blowing member 100 that is supported on the branch pipe 12 via the upstream protecting member 98 and feeds a gas into the branch pipe 12 via the upstream opening 63a, and a downstream protecting member 99 that covers the downstream opening 64a and the downstream slide damper 66.

The upstream protecting member 98 has a plurality of upstream through holes 98a that permit passage of the atmosphere. The downstream protecting member 99 has a plurality of downstream through holes 99a that permit passage of the atmosphere.

The blowing member 100 includes, for example, a blowing fan. However, with an arrangement that the gas can be fed to the upstream space 63 via the upstream opening 63a, the blowing member does not have to be a blowing fan. The discharge unit 5 according to the third modified example further includes a blowing member driving mechanism 101 that drives the blowing member 100. When the blowing member 100 is a blowing fan, the blowing member driving mechanism 101 includes, for example, an electric motor that rotates the blowing fan.

By feeding the atmosphere around the branch pipe 12 (external atmosphere) to the upstream space 63 from the blowing member 100 in a state where the upstream opening 63a is opened, it is possible to promptly and sufficiently increase the pressure of the upstream space 63.

Figure 17A:
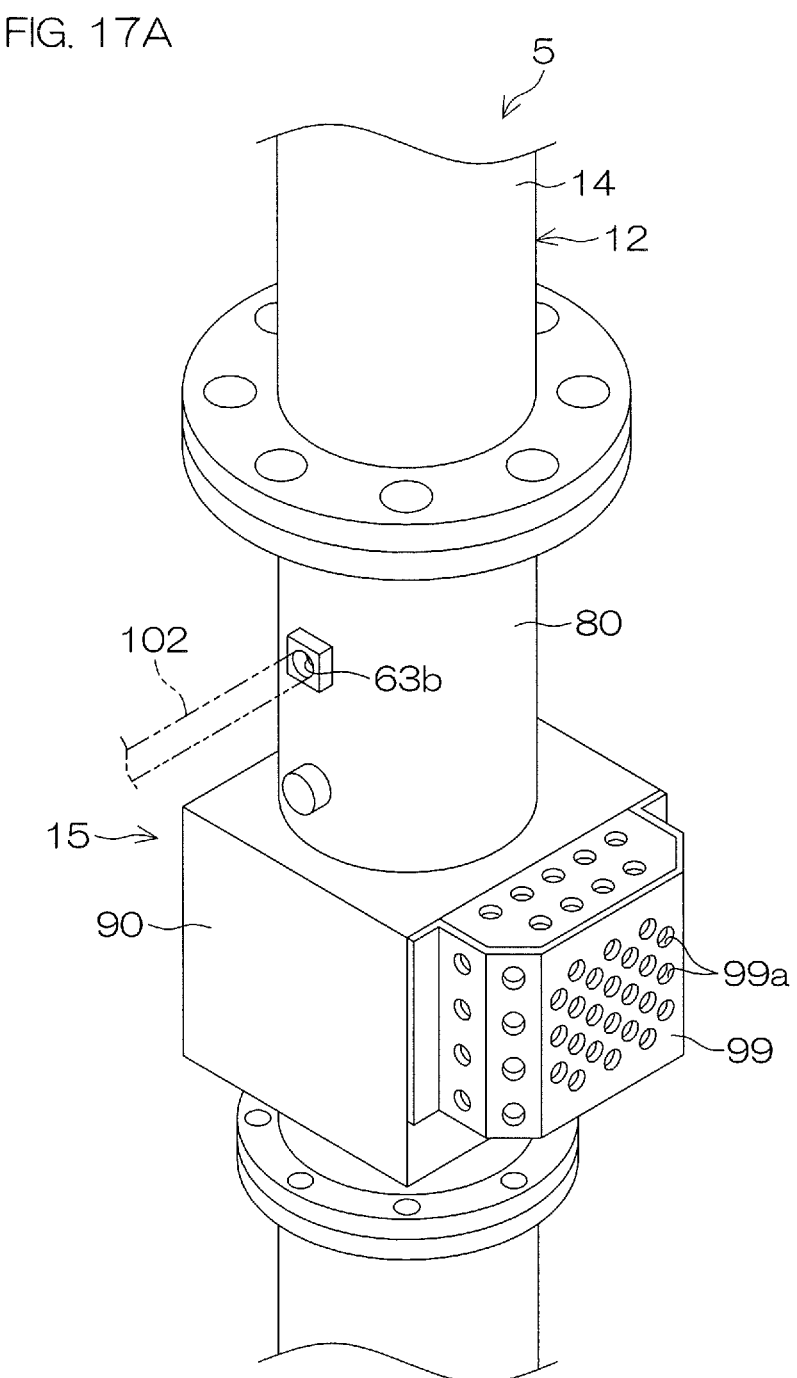
FIG. 17A is a schematic diagram for describing a discharge unit according to a fourth modified example.
Figure 17B:
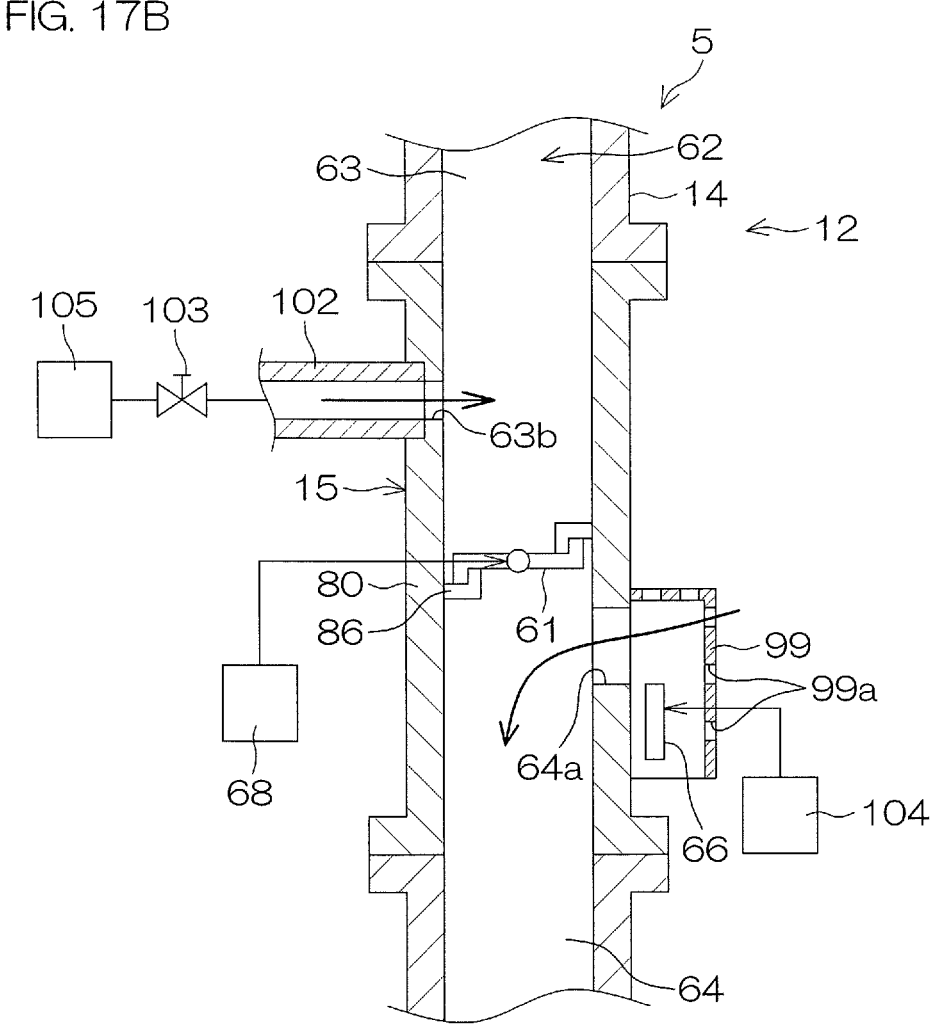
FIG. 17B is a schematic diagram for describing the discharge unit according to the fourth modified example.

FIG. 17A is a schematic diagram for describing the discharge unit 5 according to the fourth modified example. FIG. 17B is a schematic diagram for describing the discharge unit 5 according to the fourth modified example.

In the discharge unit 5 according to the fourth modified example, the upstream opening 63a and the upstream slide damper 65 are not provided unlike the discharge unit 5 shown in FIG. 4. Instead, the branch pipe 12 according to the fourth modified example has a supply hole 63b penetrating through the branch pipe 12 on the downstream side of the upstream damper 60 and on the upstream side of the downstream damper 61.

The discharge unit 5 according to the fourth modified example further includes a supply pipe 102 that is connected to the branch pipe 12 on the downstream side of the upstream damper 60 and on the upstream side of the downstream damper 61 and supplies a gas to the branch pipe 12 via the supply hole 63b.

The gas supplied to the branch pipe 12 via the supply pipe 102 is, for example, an inert gas such as a nitrogen gas, or the air, etc.

The discharge unit 5 according to the fourth modified example further includes a supply valve 103 that is provided in the supply pipe 102 and opens/closes the supply pipe 102. Strictly speaking, the supply valve 103 opens/closes a supply flow path arranged by a space in the supply pipe 102. The supply valve 103 is an example of a supply switching member that switches the state of the upstream space 63 between a supply state where the gas is supplied to the upstream space 63 via the supply pipe 102 and a supply stop state where supply of the gas to the upstream space 63 via the supply pipe 102 is stopped. By supplying the gas to the upstream space 63 via the supply pipe 102, it is possible to promptly and sufficiently increase the pressure of the upstream space 63. When the gas is supplied to the upstream space 63 via the supply pipe 102, components and a flow rate of the gas supplied to the upstream space 63 are easily and strictly adjusted.

A supply device 105 such as a compressor that feeds the gas to the supply pipe 102 is attached to the supply pipe 102. The supply device 105 may arrange part of the substrate processing apparatus 1 or may be provided in a clean room where the substrate processing apparatus 1 is installed or a facility associated with the clean room.

The gas (atmosphere) from the supply pipe 102 is an example of the external atmosphere from a different route from the main pipe 11. Therefore, the supply valve 103 is an example of the upstream switching member.

The statement "the state of the upstream space 63 can be switched between the supply state and the supply stop state" means that the state of the upstream space 63 can be switched from the supply state to the supply stop state and the state of the upstream space 63 can be switched from the supply stop state to the supply state.

The discharge unit 5 according to the fourth modified example further includes the downstream protecting member 99 that covers the downstream opening 64a and the downstream slide damper 66. The downstream protecting member 99 has the plurality of downstream through holes 99a that permit the passage of the atmosphere. The discharge unit 5 further includes a downstream slide driving mechanism 104 that causes the downstream slide damper 66 to slide with respect to the branch pipe 12.

<Arrangement of Processing Unit According to Second Preferred Embodiment>

Figure 18:
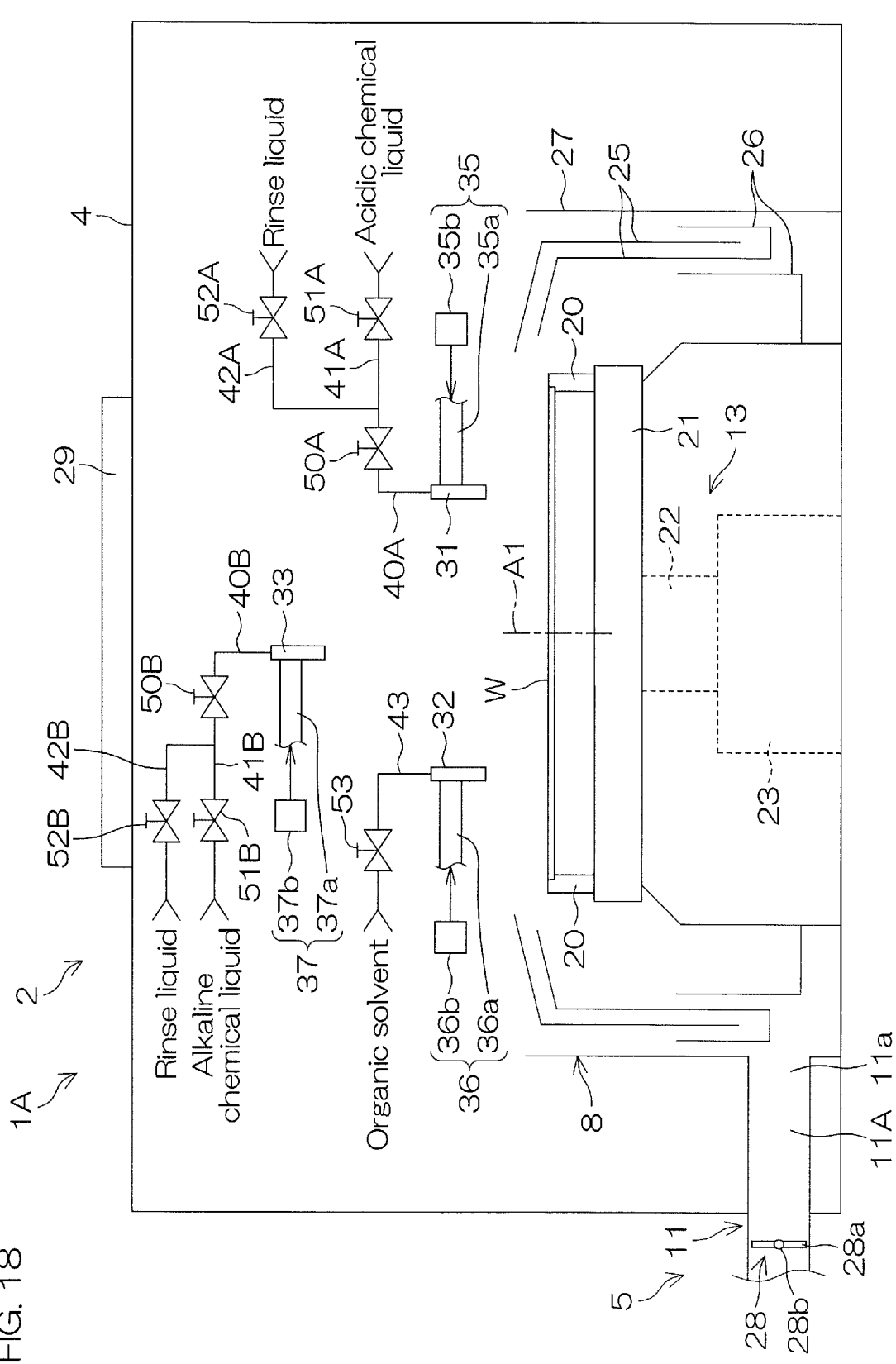
FIG. 18 is a schematic diagram for describing an arrangement of a processing unit provided in a substrate processing apparatus according to a second preferred embodiment.
Figure 19:
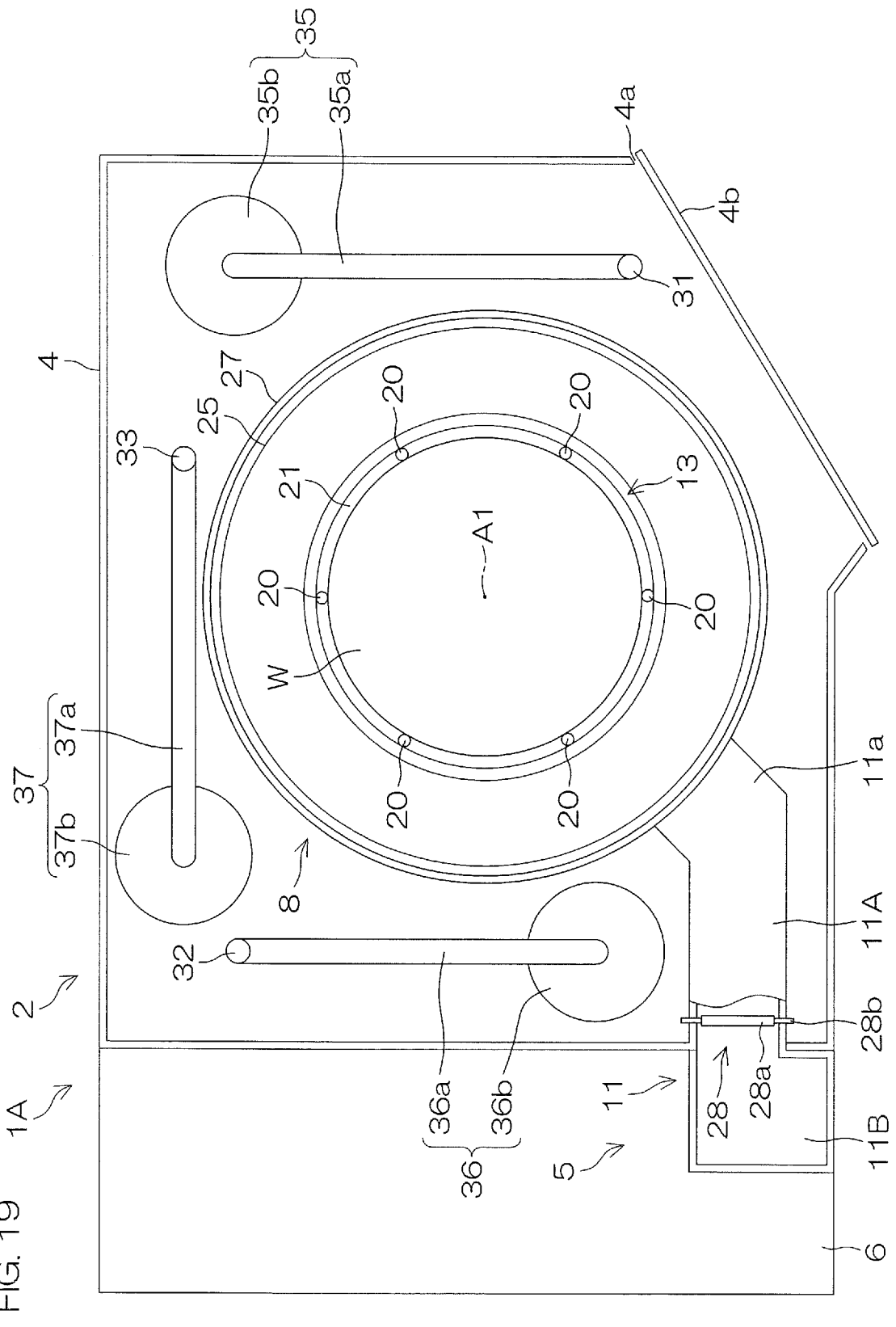
FIG. 19 is a plan view of the processing unit according to the second preferred embodiment.

FIG. 18 is a schematic diagram for describing an arrangement of a processing unit 2 provided in a substrate processing apparatus 1A according to the second preferred embodiment. FIG. 19 is a plan view of the processing unit 2 according to the second preferred embodiment.

The processing unit 2 according to the second preferred embodiment is mainly different from the processing unit 2 according to the first preferred embodiment in a point that the processing unit 2 according to the second preferred embodiment further includes a third moving nozzle 33 that selectively discharges a continuous flow of a chemical liquid and a continuous flow of a rinse liquid toward an upper surface of a substrate W held by a spin chuck 13. The third moving nozzle 33 is an example of the chemical liquid nozzle and also an example of the rinse liquid nozzle. The third moving nozzle 33 is also an example of the processing liquid nozzle.

Examples of the chemical liquid discharged from the third moving nozzle 33 are the same as the lists of the examples of the chemical liquid discharged from the first moving nozzle 31. Examples of the rinse liquid discharged from the third moving nozzle 33 are the same as the lists of the examples of the rinse liquid discharged from the first moving nozzle 31.

The chemical liquid discharged from the third moving nozzle 33 may be of a different type from a chemical liquid discharged from the first moving nozzle 31. Hereinafter, an example that the chemical liquid discharged from the first moving nozzle 31 is an acidic chemical liquid such as hydrofluoric acid and the chemical liquid discharged from the third moving nozzle 33 is an alkaline chemical liquid such as APM solution will be described.

The third moving nozzle 33 is moved in the horizontal direction by a third nozzle moving mechanism 37. The third nozzle moving mechanism 37 can move the third moving nozzle 33 between a central position and a retreat position. The third nozzle moving mechanism 37 has the same arrangement as the other nozzle moving mechanisms. That is, the third nozzle moving mechanism 37 includes a third arm 37a that supports the third moving nozzle 33, and a third arm moving mechanism 37b that moves the third arm 37a in the horizontal direction.

In the second preferred embodiment, the processing unit 2 includes a first common pipe 40A, a first chemical liquid pipe 41A, a first rinse liquid pipe 42A, a first common valve 50A, and a first rinse liquid valve 52A. The first common pipe 40A, the first chemical liquid pipe 41A, the first rinse liquid pipe 42A, the first common valve 50A, and the first rinse liquid valve 52A respectively have the same arrangements as the common pipe 40, the chemical liquid pipe 41, the rinse liquid pipe 42, the common valve 50, the chemical liquid valve 51, and the rinse liquid valve 52 according to the first preferred embodiment shown in FIG. 2.

The third moving nozzle 33 is connected to a second common pipe 40B that guides a fluid to the third moving nozzle 33. A second chemical liquid pipe 41B that supplies the chemical liquid to the second common pipe 40B and a second rinse liquid pipe 42B that supplies the rinse liquid to the second common pipe 40B are connected to the second common pipe 40B. The second common pipe 40B may be connected to the second chemical liquid pipe 41B and the second rinse liquid pipe 42B via mixing valves (not shown).

A second common valve 50B that opens/closes the second common pipe 40B is provided in the second common pipe 40B. A second chemical liquid valve 51B that opens/closes the second chemical liquid pipe 41B is provided in the second chemical liquid pipe 41B. A second rinse liquid valve 52B that opens/closes the second rinse liquid pipe 42B is provided in the second rinse liquid pipe 42B.

<Arrangement of Discharge Unit According to Second Preferred Embodiment>

Figure 20:
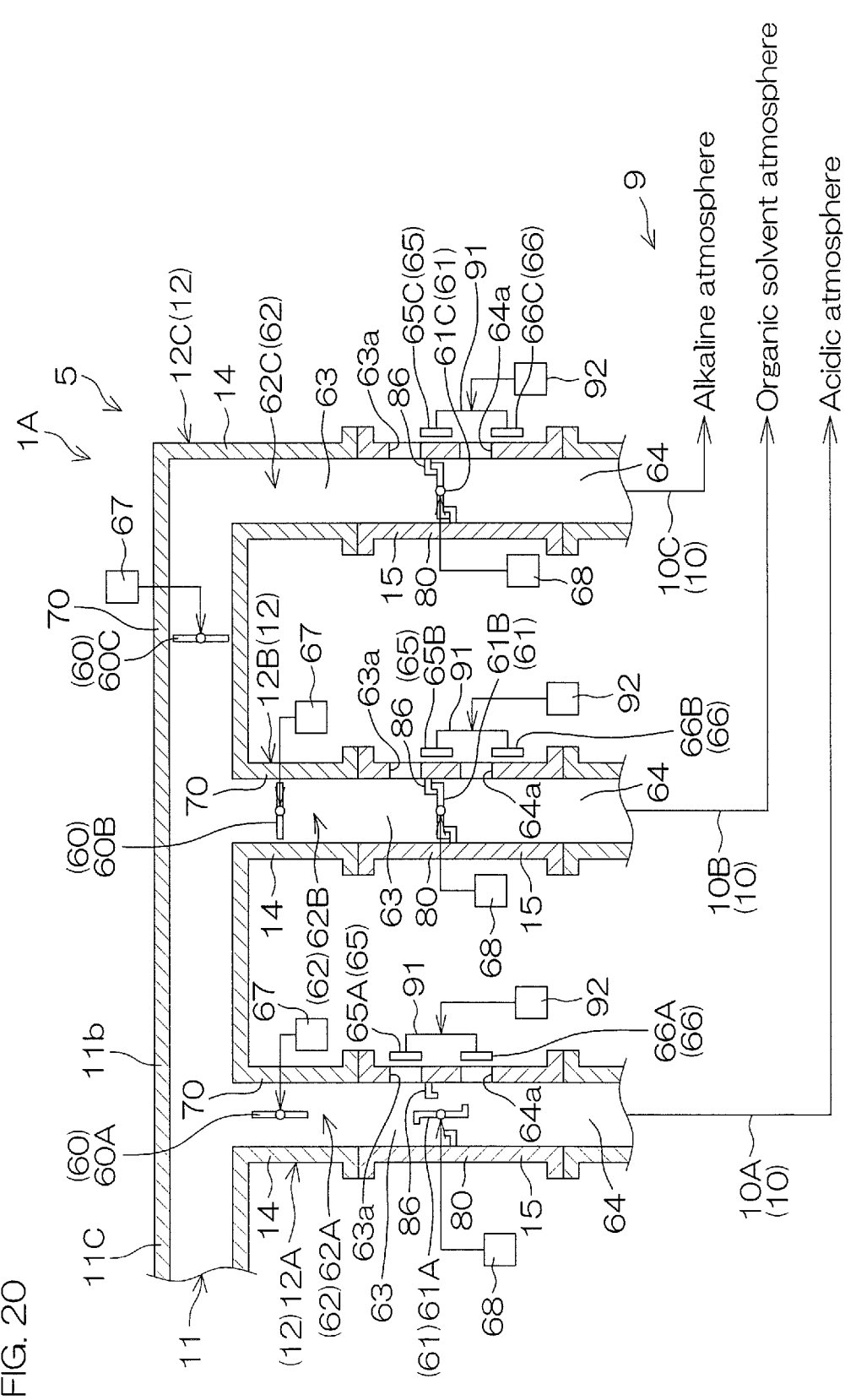
FIG. 20 is a schematic diagram for describing an arrangement of a discharge unit provided in the substrate processing apparatus according to the second preferred embodiment.

FIG. 20 is a schematic diagram for describing an arrangement of a discharge unit 5 provided in the substrate processing apparatus 1A according to the second preferred embodiment. The discharge unit 5 according to the second preferred embodiment is mainly different from the discharge unit 5 according to the first preferred embodiment (see FIG. 4) in a point that three branch pipes 12 are provided in the discharge unit 5 according to the second preferred embodiment.

That is, the discharge unit 5 according to the second preferred embodiment includes a third branch pipe 12C in addition to a first branch pipe 12A and a second branch pipe 12B. The third branch pipe 12C has the same arrangement as the first branch pipe 12A.

In detail, the third branch pipe 12C has an upstream end connected to a downstream end portion 11*b* of a main pipe 11, and a downstream end connected to a corresponding discharge duct 10. The third branch pipe 12C has an internal space 62 into which an atmosphere from the main pipe 11 can flow. The internal space 62 of the third branch pipe 12C may be called the third internal space 62C and the discharge duct 10 connected to the third branch pipe 12C may be called the third discharge duct 100.

An upstream damper 60, a downstream damper 61, an upstream slide damper 65, and a downstream slide damper 66 are provided in the third branch pipe 12C in the same way as in the other branch pipes 12. The upstream damper 60, the downstream damper 61, the upstream slide damper 65, and the downstream slide damper 66 provided in the third branch pipe 12C are respectively also called the third upstream damper 60C, the third downstream damper 61C, the third upstream slide damper 65C, and the third downstream slide damper 66C.

<Example of Substrate Processing According to Second Preferred Embodiment>

Figure 21:
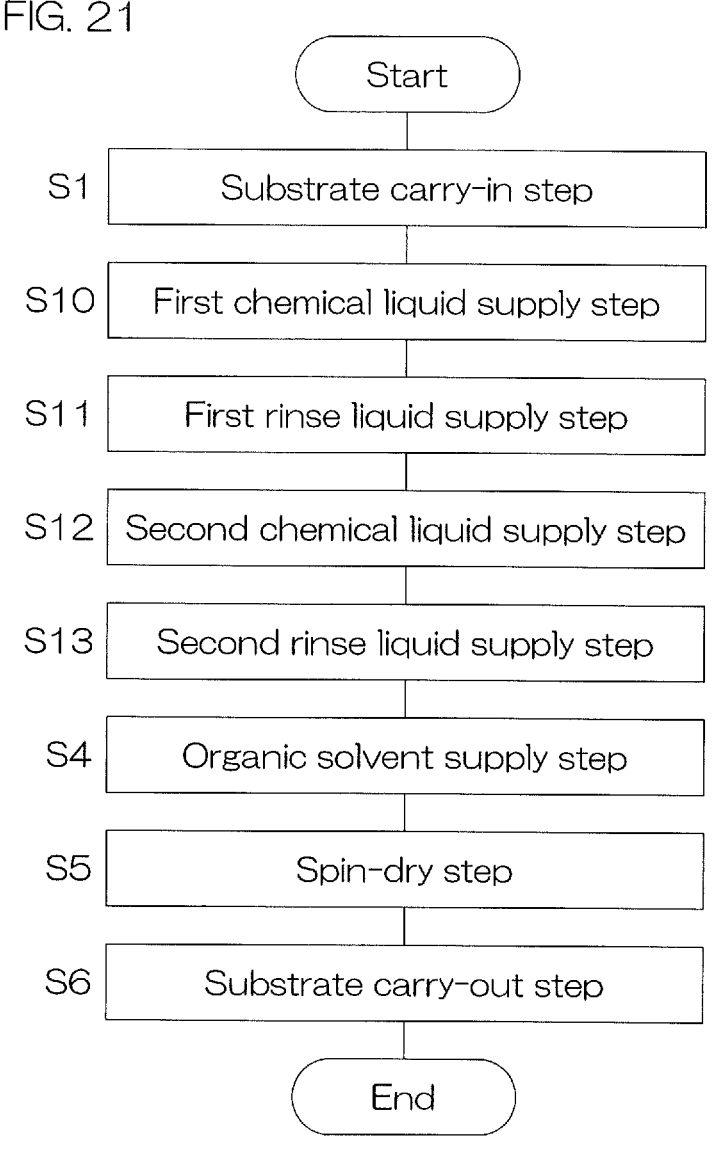
FIG. 21 is a flowchart for describing an example of substrate processing by the substrate processing apparatus according to the second preferred embodiment.

FIG. 21 is a flowchart for describing an example of substrate processing executed by the substrate processing apparatus 1A according to the second preferred embodiment. FIG. 21 mainly shows the processing realized by executing a program by a controller 3 (see FIG. 8).

In the substrate processing by the substrate processing apparatus 1A according to the second preferred embodiment, for example, as shown in FIG. 21, a substrate carry-in step (Step S1), a first chemical liquid supply step (Step S10), a first rinse liquid supply step (Step S11), a second chemical liquid supply step (Step S12), a second rinse liquid supply step (Step S13), an organic solvent supply step (Step S4), a spin-dry step (Step S5), and a substrate carry-out step (Step S6) are executed in this order.

Hereinafter, points different from the substrate processing according to the first preferred embodiment shown in FIG. 9 will be mainly described.

In the substrate processing according to the second preferred embodiment, after a second transfer robot CR is retreated out of the processing unit 2, the first chemical liquid supply step (Step S10) of supplying the acidic chemical liquid such as hydrofluoric acid to the upper surface of the substrate W is executed. Specifically, the first nozzle moving mechanism 35 moves the first moving nozzle 31 and causes the first moving nozzle 31 to oppose the upper surface of the substrate W. By opening the first common valve 50A and the first chemical liquid valve 51A in this state, a continuous flow of the acidic chemical liquid such as hydrofluoric acid is discharged (supplied) toward the upper surface of the substrate W from the first moving nozzle 31 (first chemical liquid discharge step, first chemical liquid supply step). Thereby, the upper surface of the substrate W is processed by the acidic chemical liquid.

After the first chemical liquid supply step (Step S10), the first rinse liquid supply step (Step S11) of supplying the rinse liquid to the upper surface of the substrate W is executed. Specifically, while maintaining a state where the first moving nozzle 31 opposes the upper surface of the substrate W and the common valve 50 is opened, the first chemical liquid valve 51A is closed and the first rinse liquid valve 52A is opened. Thereby, discharge of the acidic chemical liquid from the first moving nozzle 31 is stopped. Further, the continuous flow of the rinse liquid is discharged (supplied) toward the upper surface of the substrate W from the first moving nozzle 31 (first rinse liquid discharge step, first rinse liquid supply step). Thereby, the acidic chemical liquid on the upper surface of the substrate W is discharged out of the substrate W together with the rinse liquid, and the upper surface of the substrate W is cleaned.

After the first rinse liquid supply step (Step S11), the second chemical liquid supply step (Step S12) of supplying the alkaline chemical liquid such as APM solution to the upper surface of the substrate W is executed. Specifically, discharge of the rinse liquid from the first moving nozzle 31 is stopped and the first moving nozzle 31 is retreated. The third nozzle moving mechanism 37 moves the third moving nozzle 33 and causes the third moving nozzle 33 to oppose the upper surface of the substrate W. By opening the second common valve 50B and the second chemical liquid valve 51B in this state, a continuous flow of the alkaline chemical liquid is discharged (supplied) toward the upper surface of the substrate W from the third moving nozzle 33 (second chemical liquid discharge step, second chemical liquid supply step). Thereby, the upper surface of the substrate W is processed by the alkaline chemical liquid.

After the second chemical liquid supply step (Step S12), the second rinse liquid supply step (Step S13) of supplying the rinse liquid to the upper surface of the substrate W is executed. Specifically, while maintaining a state where the third moving nozzle 33 opposes the upper surface of the substrate W and the second common valve 50B is opened, the second chemical liquid valve 51B is closed and the second rinse liquid valve 52B is opened. Thereby, discharge of the alkaline chemical liquid from the third moving nozzle 33 is stopped. Further, the continuous flow of the rinse liquid is discharged (supplied) toward the upper surface of the substrate W from the third moving nozzle 33 (second rinse liquid discharge step, second rinse liquid supply step). Thereby, the alkaline chemical liquid on the upper surface of the substrate W is discharged out of the substrate W together with the rinse liquid, and the upper surface of the substrate W is cleaned.

After the second rinse liquid supply step (Step S13), the organic solvent supply step (Step S4), the spin-dry step (Step S5), and the substrate carry-out step (Step S6) are executed.
<State of Discharge Unit During Substrate Processing According to Second Preferred Embodiment>

Figure 22A:
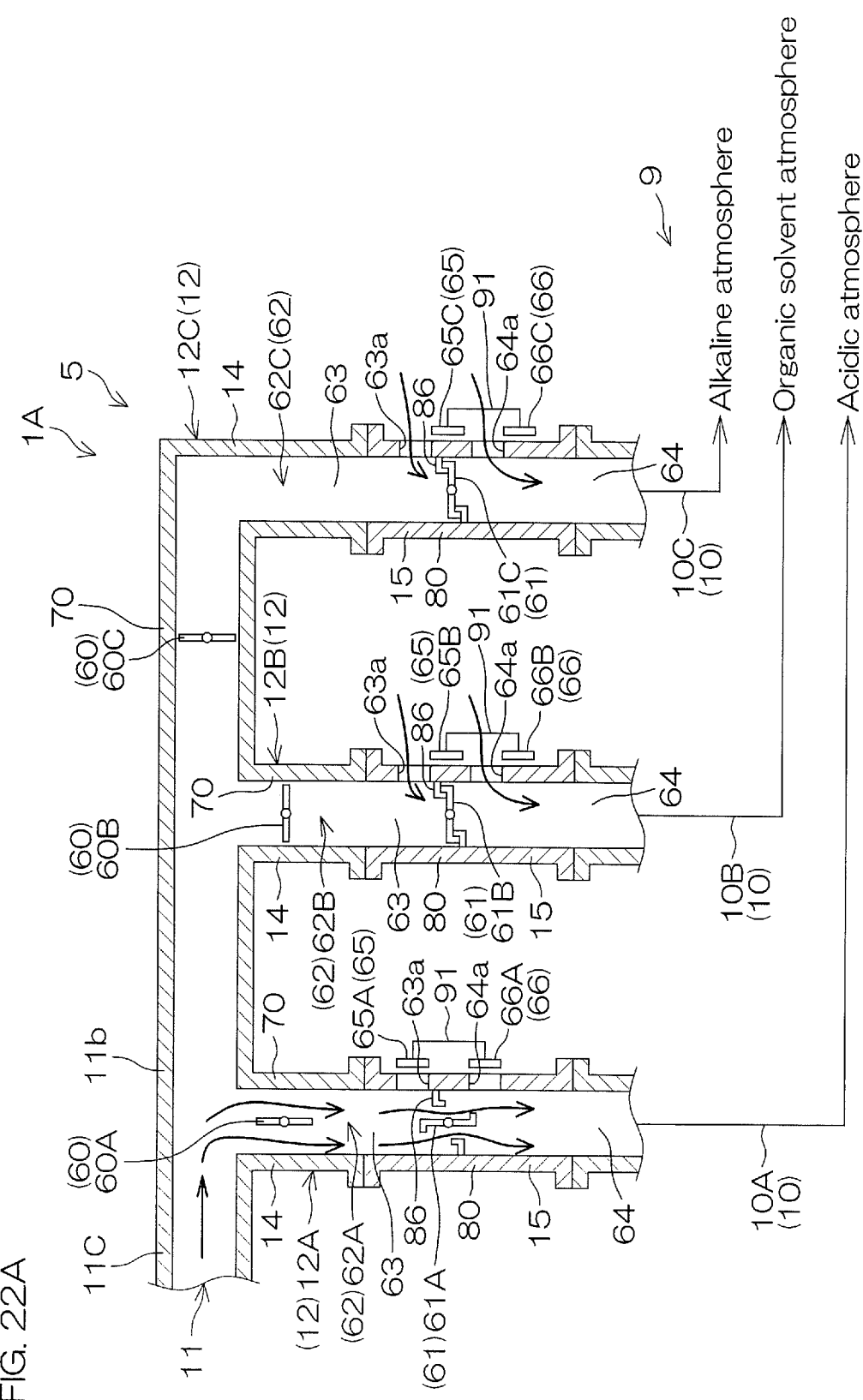
FIG. 22A is a schematic diagram for describing a state of the discharge unit when the substrate processing according to the second preferred embodiment is performed.
Figure 22B:
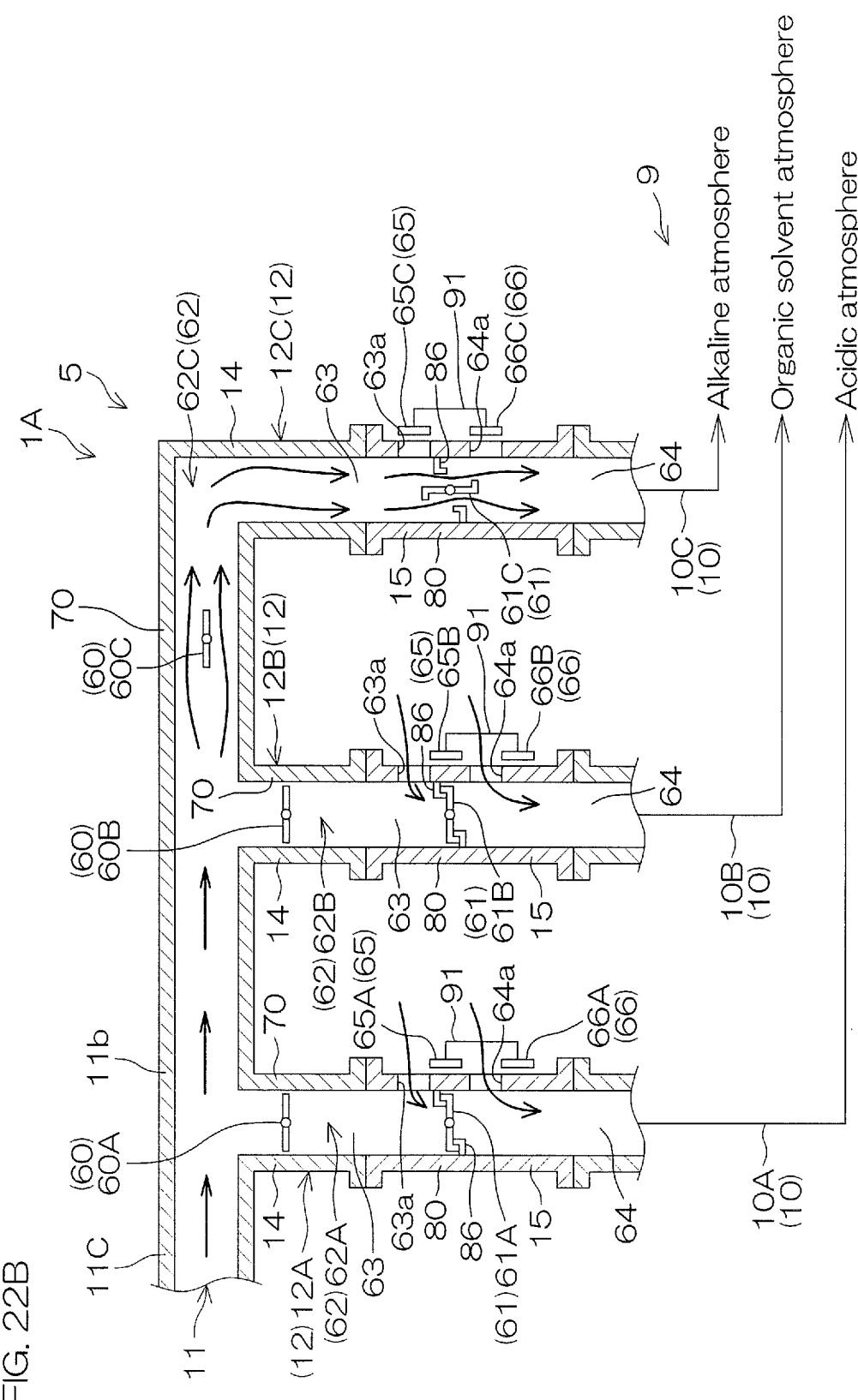
FIG. 22B is a schematic diagram for describing a state of the discharge unit when the substrate processing according to the second preferred embodiment is performed.
Figure 22C:
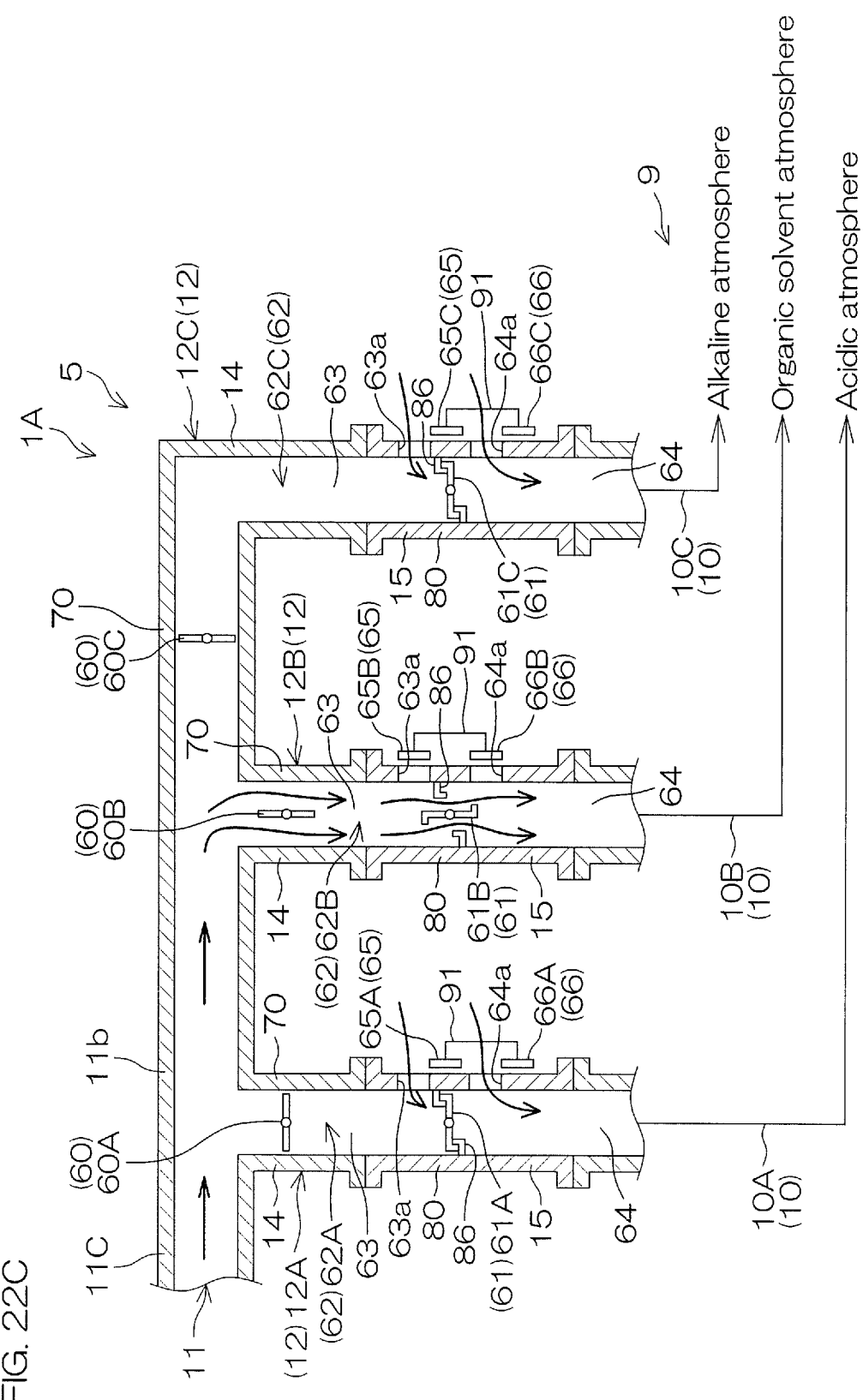
FIG. 22C is a schematic diagram for describing a state of the discharge unit when the substrate processing according to the second preferred embodiment is performed.

Next, states of the discharge unit 5 during the substrate processing according to the second preferred embodiment will be described. FIGS. 22A to 22C are schematic diagrams for describing states of the discharge unit 5 when the substrate is performed.

While the first chemical liquid supply step (Step S10) and the first rinse liquid supply step (Step S11) are executed, as shown in FIG. 22A, the first upstream damper 60A and the first downstream damper 61A are opened, and the first upstream slide damper 65A and the first downstream slide damper 66A are closed. Meanwhile, the second upstream damper 60B, the second downstream damper 61B, the third upstream damper 60C, and the third downstream damper 61C are closed, and the second upstream slide damper 65B, the second downstream slide damper 66B, the third upstream slide damper 65C and the third downstream slide damper 66C are opened.

Therefore, an acidic atmosphere from the chamber 4 flows into the first branch pipe 12A via the main pipe 11. The acidic atmosphere flowing into the first branch pipe 12A is discharged to the first discharge duct 10A from the first branch pipe 12A. Meanwhile, an external atmosphere flows into an upstream space 63 and a downstream space 64 of the second branch pipe 12B. Similarly, the external atmosphere also flows into an upstream space 63 and a downstream space 64 of the third branch pipe 12C. Therefore, while suppressing a sudden change in discharge amount of the atmosphere from the second branch pipe 12B and the third branch pipe 12C, it is possible to suppress the acidic atmosphere from mixing into the atmosphere discharged from the second branch pipe 12B and the third branch pipe 12C.

After the first rinse liquid supply step (Step S11), at the time of starting the second chemical liquid supply step (Step S12), as shown in FIG. 22B, the first upstream damper 60A and the first downstream damper 61A are closed, and the first upstream slide damper 65A and the first downstream slide damper 66A are opened. Meanwhile, the third upstream damper 60C and the third downstream damper 61C are opened, and the third upstream slide damper 65C and the third downstream slide damper 66C are closed. The second upstream damper 60B and the second upstream damper 60B are maintained to be closed, and the upstream slide damper 65B and the second downstream slide damper 66B are maintained to be opened.

Therefore, an alkaline atmosphere from the chamber 4 flows into the third branch pipe 12C via the main pipe 11. The alkaline atmosphere flowing into the third branch pipe 12C is discharged to the third discharge duct 100 from the third branch pipe 12C. Meanwhile, the external atmosphere flows into an upstream space 63 and a downstream space 64 of the first branch pipe 12A. Similarly, the external atmosphere also flows into the upstream space 63 and the downstream space 64 of the second branch pipe 12B. Therefore, while suppressing a sudden change in discharge amount of the atmosphere from the first branch pipe 12A and the second branch pipe 12B, it is possible to suppress the alkaline atmosphere from mixing into the atmosphere discharged from the first branch pipe 12A and the second branch pipe 12B.

After the second rinse liquid supply step (Step S13), at the time of starting the organic solvent supply step (Step S4), as shown in FIG. 22C, the third upstream damper 60C and the third downstream damper 61C are closed, and the third upstream slide damper 65C and the third downstream slide damper 66C are opened. Meanwhile, the second upstream damper 60B and the second downstream damper 61B are opened, and the second upstream slide damper 65B and the second downstream slide damper 66B are closed. The first upstream damper 60A and the first upstream damper 60A are maintained to be closed, and the first upstream slide damper 65A and the first downstream slide damper 66A are maintained to be opened.

Therefore, the organic solvent atmosphere from the chamber 4 flows into the second branch pipe 12B via the main pipe 11. The organic solvent atmosphere flowing into the second branch pipe 12B is discharged to the second discharge duct 10B form the second branch pipe 12B. Meanwhile, the external atmosphere flows into the upstream space 63 and the downstream space 64 of the first branch pipe 12A. Similarly, the external atmosphere also flows into the upstream space 63 and the downstream space 64 of the third branch pipe 12C. Therefore, while maintaining a discharge amount of the atmosphere from the first branch pipe 12A and the third branch pipe 12C, it is possible to suppress the organic solvent atmosphere from mixing into the atmosphere discharged from the first branch pipe 12A and the third branch pipe 12C.

According to the second preferred embodiment, the same effects as the first preferred embodiment are exerted.

In the substrate processing by the substrate processing apparatus 1A according to the second preferred embodiment, unlike the substrate processing shown in FIG. 21, the alkaline chemical liquid may be supplied to the upper surface of the substrate W in the first chemical liquid supply step, and the acidic chemical liquid may be supplied to the upper surface of the substrate W in the second chemical liquid supply step. By the substrate processing apparatus 1A according to the second preferred embodiment, it is also possible to execute the substrate processing according to the modified example shown in FIGS. 13A and 13B.

In the second preferred embodiment, it is also possible to apply the modified examples related to the discharge unit 5 (modified examples shown in FIGS. 14 to 17B), similar to the first preferred embodiment.

Other Preferred Embodiments

The present invention is not restricted to the contents of the above described preferred embodiments and various modifications are possible.

In the preferred embodiments described above, the example that the two or three branch pipes 12 are provided is described. However, the number of the branch pipes 12 may be four or more.

Unlike the preferred embodiments described above, it is also possible to use a butterfly damper as the upstream switching member. For example, it is possible to provide the supply pipe 102 as in the discharge unit 5 according to the third modified example, and provide the butterfly damper serving as the upstream switching member in the supply pipe 102.

Unlike the preferred embodiments described above, a downstream blowing member (not shown) that feeds the external atmosphere to the downstream space 64 via the downstream opening 64a may be provided. Unlike the preferred embodiments described above, the downstream opening 64a may not be provided, and a supply pipe (downstream supply pipe) connected to the branch pipe 12 on the downstream side of the downstream damper 61 may be provided. In that case, as the downstream switching member, for example, a downstream supply valve (not shown) that switches the state of the downstream space 64 between a state where the gas is supplied to the downstream space 64 via the downstream supply pipe and a state where supply of the gas to the downstream space 64 via the downstream supply pipe is stopped is provided. In a case where the downstream supply pipe is provided, it is also possible to use a butterfly damper as the downstream switching member.

In the preferred embodiments described above, the upstream end portion 11a of the main pipe 11 is connected to the outer wall member 27 of the processing cup 8. An arrangement of the main pipe 11 may be an arrangement to connect the chamber 4 and the plurality of branch pipes 12. For example, the upstream end portion 11a of the main pipe 11 may be connected to the guards 25 or the cups 26.

The upstream end portion 11a of the main pipe 11 may be connected to the side wall 7c of the chamber 4. In that case, the main pipe 11 is arranged by an upstream main pipe connected to the side wall 7c of the chamber 4 and positioned out of the chamber 4 (fluid box 6), and a downstream main pipe connected to the upstream main pipe and positioned on the lower side of the lower wall 7a of the frame 7.

Instead of the upstream slide damper 65, a damper that opens/closes the upstream opening 63a by an action other than sliding may be used as an upstream opening/closing damper. For example, as the upstream opening/closing damper, a damper to be moved to come close to an outer surface of the branch pipe 12 and away from the outer surface of the branch pipe 12 may be provided. As the upstream opening/closing damper, a turning type damper that opens/closes the upstream opening 63a by being turned around a turning axis fixed to the branch pipe 12 may be provided.

Similarly, instead of the downstream slide damper 66, a damper that opens/closes the downstream opening 64a by an action other than sliding may be used as a downstream opening/closing damper.

Each of the dampers provided in the plurality of branch pipes 12 is not required to have the same arrangements. For example, arrangements of each of the dampers corresponding to the first branch pipe 12A may be the arrangements shown in FIG. 4, and arrangements of each of the dampers corresponding to the second branch pipe 12B may be the arrangements shown in FIGS. 16A and 16B. The arrangements of each of the dampers corresponding to the first branch pipe 12A may be the arrangements shown in FIG. 4, and the arrangements of each of the dampers corresponding to the second branch pipe 12B may be the arrangements shown in FIGS. 17A and 17B. That is, in each of the branch pipes 12, it is possible to freely combine the arrangements of the dampers described above.

It is possible to provide the upstream opening/closing speed adjusting mechanisms 93, the downstream opening/closing speed adjusting mechanisms 94, and the flow rate adjusting mechanism 95 provided in the discharge unit 5 according to the first modified example shown in FIG. 14, irrespective of types of the dampers. For example, the flow rate adjusting mechanism 95 is not limited to a mechanism of controlling an opening/closing action of the upstream slide damper 65 and the downstream slide damper 66, but may be a mechanism of controlling an opening/closing action of the dampers other than the slide dampers. That is, the flow rate adjusting mechanism 95 is only required to control a switching action of the upstream switching member and the downstream switching member.

The slide driving mechanism 92 shown in FIG. 7 causes the upstream slide damper 65 and the downstream slide damper 66 to slide with respect to the branch pipe 12 by driving the coupling member 91. However, the coupling member 91 may not be provided, and a driving mechanism that causes the upstream slide damper 65 and the downstream slide damper 66 to slide separately with respect to the branch pipe 12 may be provided.

In the first preferred embodiment, unlike the downstream damper 61, the sealing structure 86 is not provided in the upstream damper 60. However, a sealing structure 86 that seals a space between the upstream inner peripheral surface 70a and the upstream valve element 71 may be provided.

The first upstream damper 60A and the second upstream damper 60B are exposed to the chemical liquid atmosphere in the chemical liquid atmosphere discharge state. Therefore, crystals of the chemical liquid may be attached to the upstream dampers 60. Thus, in a case where the sealing structure 86 is provided in the upstream damper 60, there is a possibility that rotation of the upstream valve element 71 is blocked by the crystals of the chemical liquid. Therefore, it is preferable not to provide the sealing structure 86 in the upstream damper 60.

In the preferred embodiments described above, the sealing structure 86 is provided in the downstream damper 61. However, in the preferred embodiments described above, the sealing structure 86 may not be provided.

The first upstream damper 60A and the second upstream damper 60B are exposed to the chemical liquid atmosphere when the chemical liquid atmosphere is flowing into the main pipe 11, and exposed to the organic solvent atmosphere when the organic solvent atmosphere is flowing into the main pipe 11. Therefore, the first downstream damper 61A and the second downstream damper 61B are exposed to the chemical liquid atmosphere and the organic solvent atmosphere for a shorter time than the first upstream damper 60A and the second upstream damper 60B.

Therefore, the crystals of the chemical liquid are not easily attached to the first downstream damper 61A and the second downstream damper 61B. Thus, even in a case where the sealing structure 86 is provided, it is possible to suppress blockage of rotation of the downstream valve element 81 due to attachment of the crystals of the chemical liquid, and promptly and sufficiently increase the pressure of the upstream space 63 of the branch pipe 12. Therefore, it is preferable to provide the sealing structure 86 in the first downstream damper 61A and the second downstream damper 61B.

Unlike the third modified example, the blowing member 100 may not be provided in the discharge unit 5, but the discharge unit 5 may be arranged to include the upstream protecting member 98 that covers the upstream opening 63a and the upstream slide damper 65, and the downstream protecting member 99 that is supported on the branch pipe 12 via the upstream protecting member 98 and covers the downstream opening 64a and the downstream slide damper 66.

In the preferred embodiments described above, the spin chuck 13 is the gripping type spin chuck 13 that grips a peripheral edge of the substrate W by the plurality of chuck pins 20. However, the spin chuck 13 is not limited to the gripping type spin chuck 13. For example, the spin chuck 13 may be a vacuum absorption type spin chuck 13 that absorbs the substrate W onto the spin base 21.

In the preferred embodiments described above, the processing liquids are arranged to be discharged from the plurality of moving nozzles. However, unlike the preferred embodiments described above, the processing liquids may be arranged to be discharged from fixed nozzles whose positions in the horizontal direction are fixed, or all the processing liquids may be arranged to be discharged from a single nozzle.

In the preferred embodiments described above, the controller 3 controls the entire substrate processing apparatus 1. However, the controller 3 that controls each of the members of the substrate processing apparatus 1 may be dispersed at a plurality of points.

In the preferred embodiments described above, the expressions "along," "horizontal," and "vertical" are used but not required to strictly mean "along," "horizontal," and "vertical." That is, the expressions permit deviation in manufacturing precision, installation precision, etc.

The arrangements are schematically shown by blocks in some cases. However, shapes, sizes, and positional relationships of the blocks do not indicate shapes, sizes, and positional relationships of the arrangements.

The first moving nozzle 31 is an example of the processing liquid nozzle, the chemical liquid nozzle, and the rinse liquid nozzle. The second moving nozzle 32 is an example of the processing liquid nozzle and the organic solvent nozzle. The third moving nozzle 33 is an example of the processing liquid nozzle, the chemical liquid nozzle, and the rinse liquid nozzle. The upstream slide damper 65 is an example of the upstream switching member and the upstream opening/closing damper. The downstream slide damper 66 is an example of the downstream switching member and the downstream opening/closing damper. The flow rate adjusting mechanism 95 is an example of the downstream flow rate adjusting mechanism. The supply valve 103 is an example of the upstream switching member.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
a chamber that houses a substrate;
a main pipe that discharges an atmosphere in the chamber;
a plurality of branch pipes connected to the main pipe, each of the branch pipes having an internal space into which the atmosphere flows from the main pipe;
a plurality of upstream dampers each of which is provided for a corresponding one of the branch pipes and opens/closes the corresponding branch pipe;
a plurality of downstream dampers each of which is provided for a corresponding one of the branch pipes on the downstream side of the upstream damper and opens/closes the corresponding branch pipe;
wherein the internal space of each of the branch pipes is comprised of an upstream space located between a corresponding one of the upstream dampers and a corresponding one of the downstream dampers and a downstream space located downstream of the corresponding one of the downstream dampers; and wherein said branch pipes are surrounded by an external atmosphere existing in the chamber outside of said main pipe and outside of said branch pipes;
an upstream opening/closing damper that is controllable to either connect said upstream space to said external atmosphere to enable said external atmosphere to flow into said upstream space or to prevent the inflow of the external atmosphere into said upstream space; and
a downstream opening/closing damper that is controllable to either connect said downstream space to said external atmosphere to enable said external atmosphere to flow into said downstream space or to prevent the inflow of the external atmosphere into said downstream space.

2. The substrate processing apparatus according to claim 1, wherein
each of said branch pipes has an upstream inner peripheral surface having a circular shape in a cross-sectional view at a position where the upstream damper is provided, and
each of said upstream dampers includes an upstream valve having a shape along the upstream inner peripheral surface and opens/closes the branch pipe by being rotated in the branch pipe.

3. The substrate processing apparatus according to claim 1, wherein
the branch pipe has a downstream inner peripheral surface having a circular shape in a cross-sectional view at a position where the downstream damper is provided, and
the downstream damper includes a downstream valve that has a shape along the downstream inner peripheral surface and that opens/closes the branch pipe by being rotated in the branch pipe.

4. The substrate processing apparatus according to claim 3, further comprising a seal that seals a space between the downstream inner peripheral surface and the downstream valve when the downstream valve closes the branch pipe.

5. The substrate processing apparatus according to claim 1, wherein
each of the branch pipes has an upstream opening that connects the upstream space and a space around the branch pipe, and
the upstream opening/closing damper opens/closes the upstream opening.

6. The substrate processing apparatus according to claim 5, further comprising a blowing member that is provided in an exterior of the branch pipe and feeds an atmosphere around the branch pipe to the upstream space via the upstream opening.

7. The substrate processing apparatus according to claim 1, further comprising a supply pipe connected to the branch pipe at a position on the downstream side of the upstream damper and on the upstream side of the downstream damper, wherein the upstream opening/closing damper is effective to control a state of the upstream space based on whether a gas is supplied or not supplied to the upstream space via the supply pipe.

8. The substrate processing apparatus according to claim 1, wherein
each of the branch pipes has a downstream opening that connects the downstream space and a space around the branch pipe, and
the downstream opening/closing damper opens/closes the downstream opening.

9. The substrate processing apparatus according to claim 1, wherein each of the branch pipes has an upstream opening that connects the upstream space and a space around the branch pipe and a downstream opening that connects the downstream space and a space around the branch pipe, the upstream opening/closing damper includes an upstream slide damper that opens/closes the upstream opening by sliding with respect to the branch pipe, the downstream opening/closing damper includes a downstream slide damper that opens/closes the downstream opening by sliding with respect to the branch pipe, and the substrate processing apparatus further comprises:

a coupling member that couples the upstream slide damper and the downstream slide damper; and a slide driving mechanism that causes the upstream slide damper and the downstream slide damper to slide by driving the coupling member.

10. The substrate processing apparatus according to claim 1, further comprising:

an upstream opening/closing speed adjusting mechanism that adjusts opening/closing speed of the upstream damper;

a downstream opening/closing speed adjusting mechanism that adjusts opening/closing speed of the downstream damper; and a downstream flow rate adjusting mechanism that controls a switching action of the downstream opening/closing damper and adjusts a flow rate of the external atmosphere flowing into the downstream space.

11. The substrate processing apparatus according to claim 1, further comprising:

a plurality of processing liquid nozzles that discharge different types of processing liquids from each other toward the substrate housed in the chamber; and a controller programmed to switch the branch pipe into which the atmosphere discharged from the main pipe flows in accordance with the type of the processing liquid supplied to the substrate which is housed in the chamber by controlling the plurality of upstream dampers, the plurality of downstream dampers, the plurality of upstream opening/closing dampers, and the plurality of downstream opening/closing dampers.

12. The substrate processing apparatus according to claim 11, wherein the controller is programmed to start, in each of the branch pipes, the inflow of the external atmosphere to the upstream space by the upstream opening/closing damper and the inflow of the external atmosphere to the downstream space by the downstream opening/closing damper before the upstream damper and the downstream damper close the corresponding branch pipe.

13. The substrate processing apparatus according to claim 11, wherein the plurality of processing liquid nozzles include a chemical liquid nozzle that discharges a chemical liquid toward the substrate housed in the chamber, a rinse liquid nozzle that supplies a rinse liquid toward the substrate housed in the chamber, and an organic solvent nozzle that supplies an organic solvent toward the substrate housed in the chamber, and the plurality of branch pipes have a first branch pipe that discharges an atmosphere in the main pipe while the chemical liquid is discharged from the chemical liquid nozzle and while the rinse liquid is discharged from the rinse liquid nozzle, and a second branch pipe that discharges the atmosphere in the main pipe while the organic solvent is discharged from the organic solvent nozzle.

\* \* \* \* \*